(12) United States Patent
Saito

(10) Patent No.: US 10,066,942 B2
(45) Date of Patent: Sep. 4, 2018

(54) SENSOR MODULE, AND SENSOR CHIP AND PROCESSING CIRCUIT CHIP USED THEREFOR

(71) Applicant: ALPS ELECTRIC CO., LTD., Tokyo (JP)

(72) Inventor: Junichi Saito, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 132 days.

(21) Appl. No.: 15/215,244

(22) Filed: Jul. 20, 2016

(65) Prior Publication Data

US 2016/0327391 A1 Nov. 10, 2016

Related U.S. Application Data

(63) Continuation of application No. PCT/JP2015/051189, filed on Jan. 19, 2015.

(30) Foreign Application Priority Data

Jan. 22, 2014 (JP) ................................ 2014-009074

(51) Int. Cl.
*G01P 1/02* (2006.01)
*G01P 15/00* (2006.01)
(Continued)

(52) U.S. Cl.
CPC ............ *G01C 19/574* (2013.01); *G01C 19/56* (2013.01); *G01P 1/02* (2013.01); *G01P 15/00* (2013.01);
(Continued)

(58) Field of Classification Search
CPC .......... G01P 15/00; G01P 15/18; G01P 15/08; G01P 1/023; G01P 1/02; G01C 19/574; G01C 19/56
See application file for complete search history.

(56) References Cited

U.S. PATENT DOCUMENTS 5,365,768 A * 11/1994 Suzuki .................. G01D 3/022
702/104
5,490,421 A * 2/1996 Ueyanagi ................ G01P 1/006
338/2

(Continued)

FOREIGN PATENT DOCUMENTS

JP 63-81274 4/1988
JP 2-131675 11/1990
(Continued)

OTHER PUBLICATIONS

International Search Report for corresponding International Patent Application No. PCT/JP2015/051189, dated Mar. 17, 2015, 5 pages.

*Primary Examiner* — Helen Kwok
(74) *Attorney, Agent, or Firm* — Brinks Gilson & Lione

(57) ABSTRACT

A sensor chip includes sensor pads, and the first set of differential detection signal pads are symmetrically arranged on both sides of a ground pad and are centered at the ground pad, the second set of differential detection signal pads are arranged on both sides thereof, and a power supply pad is arranged in one end of the two ends of the sensor pads. A processing circuit chip includes sensor connection pads including power supply connection pads, a ground connection pad, and two sets of differential detection signal connection pads, and the power supply connection pads connectable to the power supply pad of the sensor chip are arranged in two ends of the sensor connection pads.

8 Claims, 18 Drawing Sheets

(51) Int. Cl.
*G01C 19/574* (2012.01)
*H01L 25/065* (2006.01)
*G01C 19/56* (2012.01)

(52) U.S. Cl.
CPC ...... *H01L 25/0655* (2013.01); *H01L 25/0657* (2013.01); *H01L 2224/05554* (2013.01); *H01L 2224/48137* (2013.01); *H01L 2224/48145* (2013.01); *H01L 2224/48227* (2013.01); *H01L 2224/49171* (2013.01); *H01L 2924/181* (2013.01)

(56) References Cited

U.S. PATENT DOCUMENTS

| | | | | |
|---|---|---|---|---|
| 5,864,062 | A | * | 1/1999 | Nagahara .............. B81C 1/0023 257/417 |
| 6,962,081 | B2 | * | 11/2005 | Ueyanagi ............. G01L 19/0084 73/514.18 |
| 7,412,894 | B2 | * | 8/2008 | Ueyanagi ............. G01L 19/0084 73/753 |
| 2010/0066390 | A1 | * | 3/2010 | Suzuki ..................... G01D 5/24 324/686 |
| 2012/0180563 | A1 | | 7/2012 | Wang et al. |
| 2013/0087863 | A1 | | 4/2013 | Chiou |
| 2013/0264915 | A1 | | 10/2013 | Suzuki et al. |
| 2014/0312438 | A1 | * | 10/2014 | Takada .................. B81B 7/0064 257/415 |

FOREIGN PATENT DOCUMENTS

| | | |
|---|---|---|
| JP | 7-209019 | 8/1995 |
| JP | 8-162605 | 6/1996 |
| JP | 2013-183425 | 9/2013 |

* cited by examiner

FIG. 2
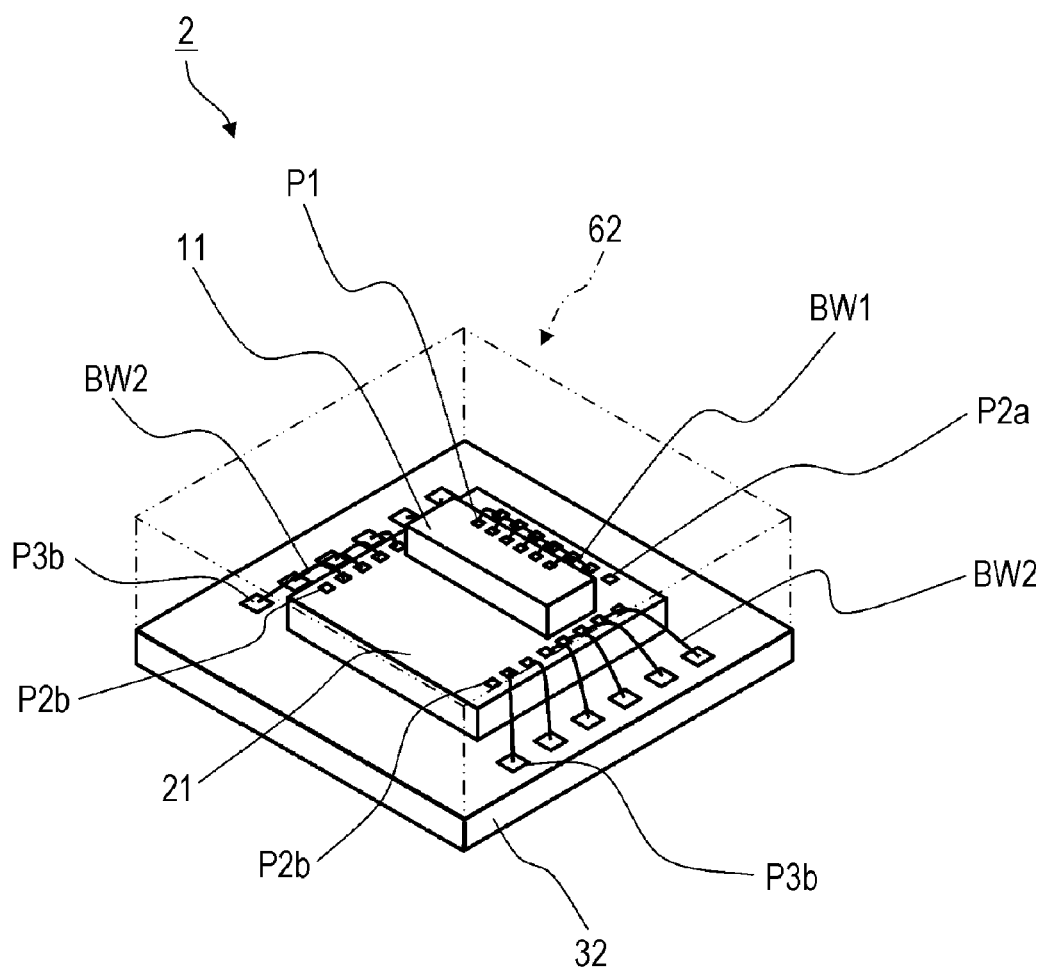
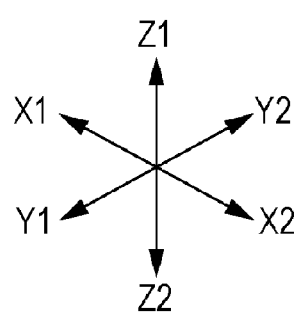

FIG. 3
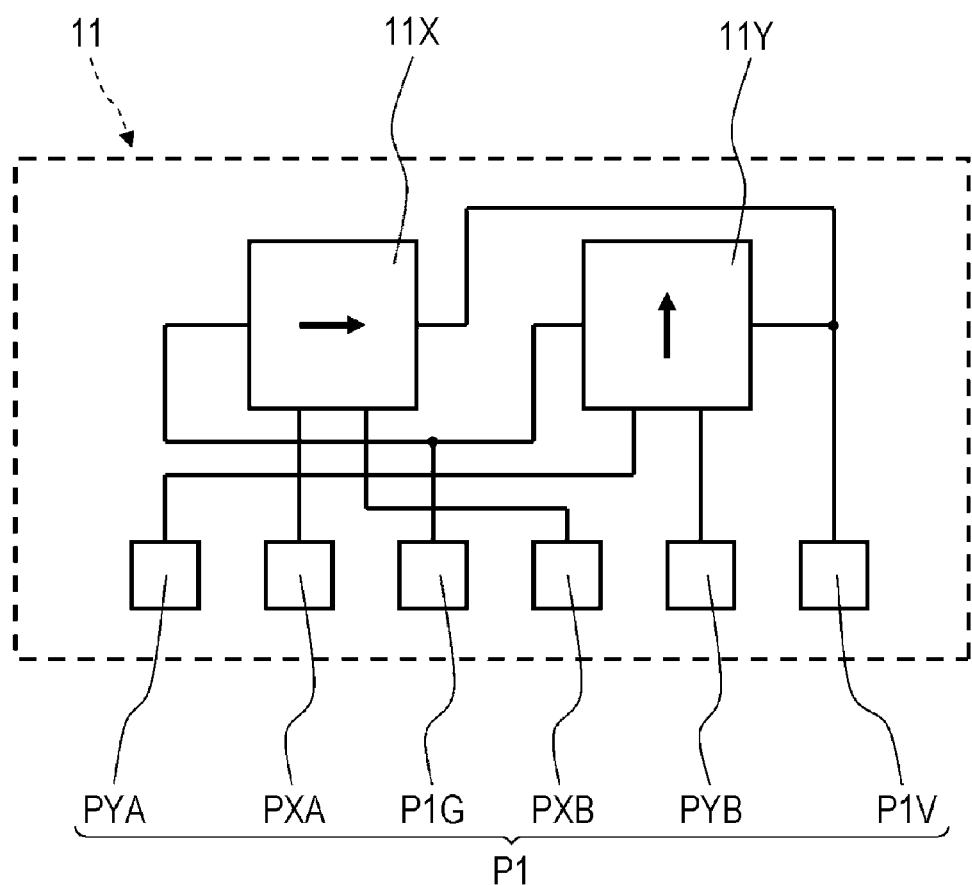
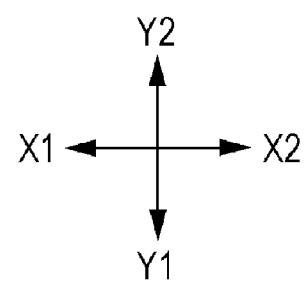

FIG. 7
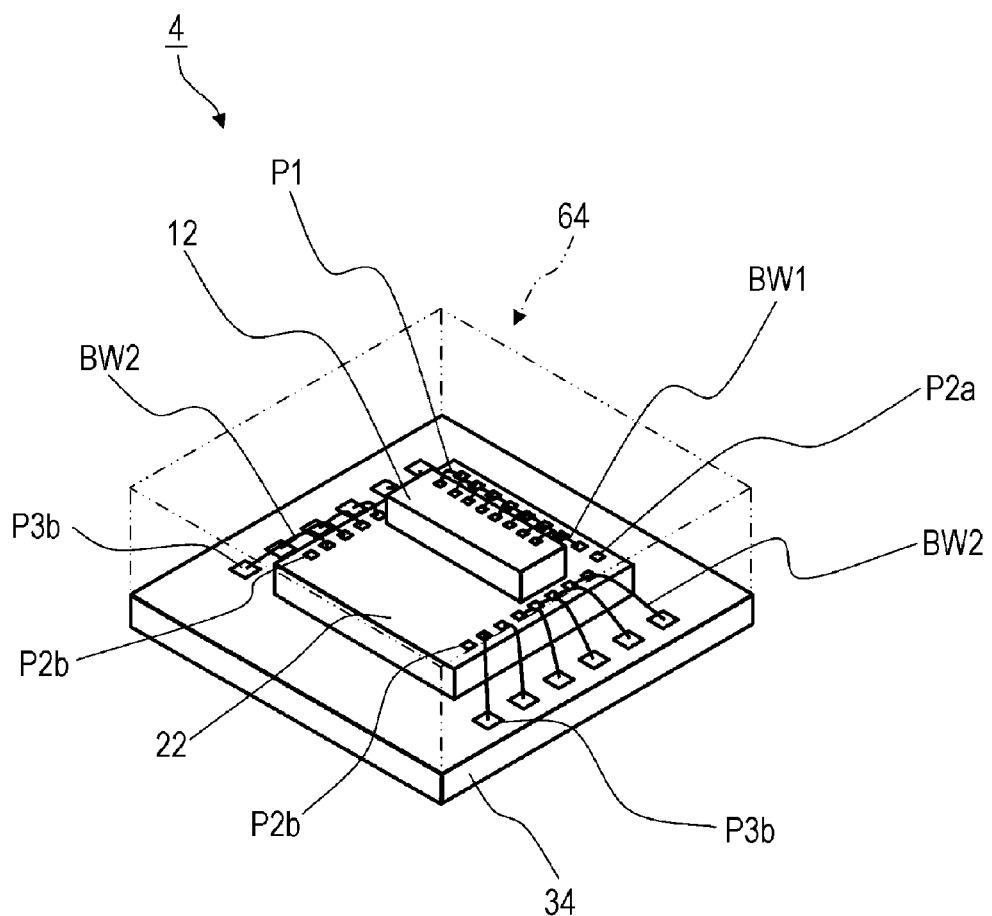
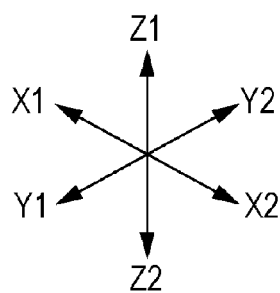

FIG. 14
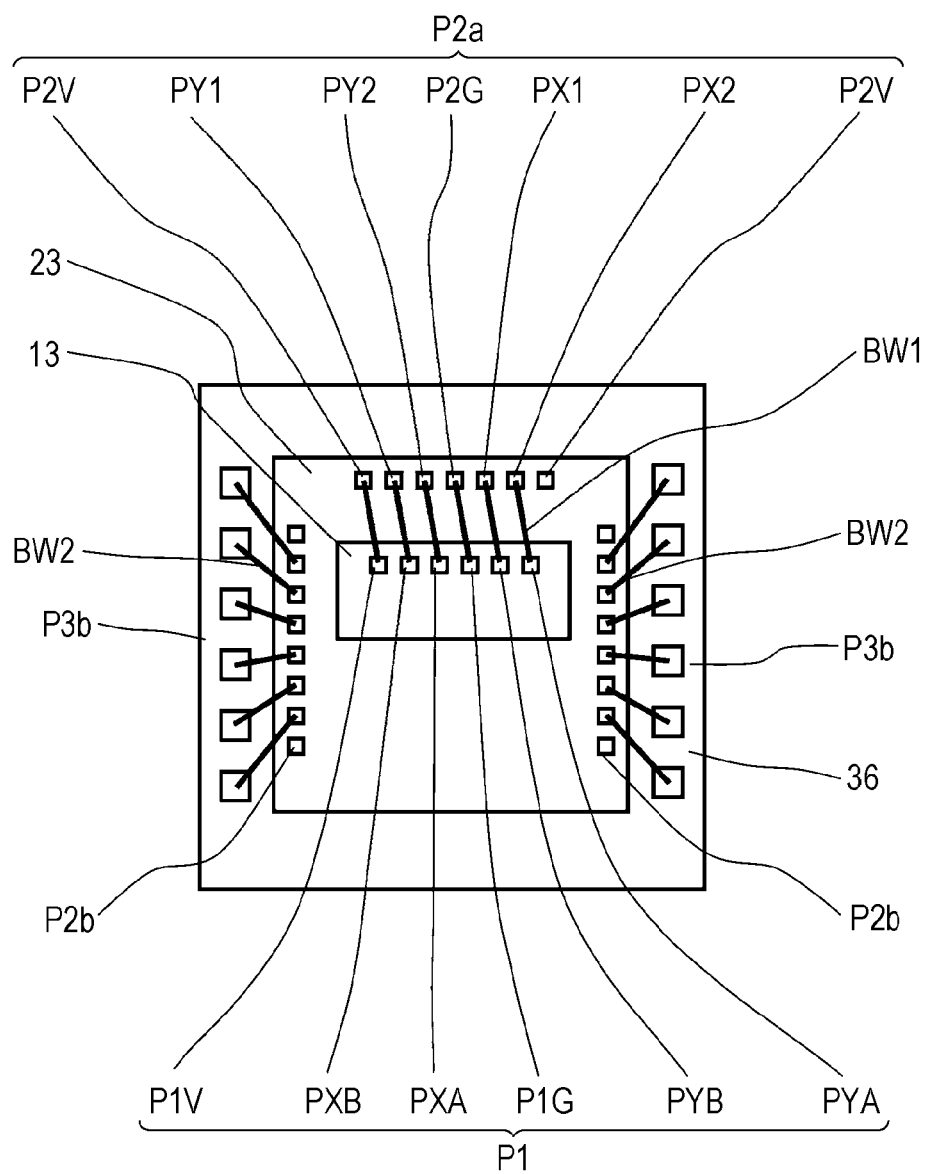
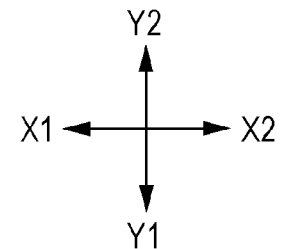

SENSOR MODULE, AND SENSOR CHIP AND PROCESSING CIRCUIT CHIP USED THEREFOR

CLAIM OF PRIORITY

This application is a Continuation of International Application No. PCT/JP2015/051189 filed on Jan. 19, 2015, which claims benefit of priority to Japanese Patent Application No. 2014-009074 filed on Jan. 22, 2014. The entire contents of each application noted above are hereby incorporated by reference.

BACKGROUND

1. Field of the Disclosure

The present disclosure relates to sensor modules each having a side-by-side structure or a chip stack structure and a sensor chip and a processing circuit chip used therefor.

2. Description of the Related Art

By using various kinds of sensors, a motion of a user or a state of a device used by the user is sensed and is used for controlling the device.

Usually, such sensors each have one molded package, in which a sensor chip and a processing circuit chip are housed, and are each provided as a sensor module made operable by connecting a power supply and a minimum number of pins therewith. While needless to say, a sensor chip and a processing circuit chip are separately molded and are connected on a printed wiring substrate by a user, thereby enabling each of such sensor modules to be realized, it is necessary to connect pins extending from the molded sensor chip and pins extending from the molded processing circuit chip with each other, thereby causing a size to be enlarged and badly influencing aspects of performance and reliability. A sensor chip and a processing circuit chip tend to be housed in one molded package, thereby making a small-sized, high-performance, and high-quality sensor module available for various purposes.

While there are various methods for housing, in one molded package, and connecting a sensor chip and a processing circuit chip with each other, there is a method for establishing connections by using wire bonding, as one of methods technologically established with low costs. Usually, it is difficult for the wire bonding to establish connections that intersect with each other. Therefore, it is necessary to decide the pad arrangements of a sensor chip and a processing circuit chip and the alignment orders thereof. Regarding the arrangement of a sensor chip and a processing circuit chip in a sensor module housed in a molded package, a side-by-side structure in which the two are arranged on a plane surface and a chip stack structure in which one of the two is stacked on the other are known as typical examples.

In, for example, Japanese Unexamined Patent Application Publication No. 2009-270905, a sensor device having the side-by-side structure is disclosed. FIG. 18 is an explanatory diagram of a sensor unit arranged in a sensor device 100 of Japanese Unexamined Patent Application Publication No. 2009-270905.

A sensor chip 110 and a processing circuit chip 120 are mounted in a leading end portion of a projecting portion 102 of a case 103 and are connected by bonding wires 111. Since being relatively easily manufactured, the side-by-side structure in which the sensor chip 110 and the processing circuit chip 120, two-dimensionally arranged, are connected by the bonding wires 111 is widely used in sensor modules each having little restriction on the size thereof.

However, in a case where, along with the recent miniaturization of sensor modules, it is necessary to reduce an area at the cost of a thickness, the chip stack structure in which the sensor chip is mounted on the processing circuit chip is used. In that case, while there is a method for translating and mounting the sensor chip on the processing circuit chip, this causes the bonding wires to pass through the upper portion of a detection unit of the sensor, thereby causing a problem on the detection accuracy of the sensor. In a case of rotating and mounting the sensor chip on the processing circuit chip in order to avoid the above-mentioned problem, the arrangement of the sensor chip and the processing circuit chip and the orders of the respective pad arrangements thereof become unmatched to each other. Accordingly, it is necessary to change the arrangement or order of pads of the sensor chip or the processing circuit chip and remanufacture from a chip, and there is a problem that a development cost is increased.

SUMMARY

A sensor module incorporates a differential type sensor chip, in which one or more sets of sensor elements to detect by using differential types are embedded, and a processing circuit chip to process a differential detection signal from the sensor chip. The sensor chip includes sensor pads arranged so as to face an outer circumference thereof. The sensor pads include a power supply pad, a ground pad, and at least a pair of differential detection signal pads. The pair of differential detection signal pads is arranged on both sides of one of the power supply pad and the ground pad, the other of the power supply pad and the ground pad is arranged in at least one end of two ends of the sensor pads. The processing circuit chip includes sensor connection pads including a power supply connection pad, a ground connection pad, and at least a pair of differential detection signal connection pads so as to correspond to the power supply pad, the ground pad, and the pair of differential detection signal pads of the sensor chip, and one or both of an arrangement in which the other of the power supply pad and the ground pad of the sensor chip is arranged in each of the two ends of the sensor pad and an arrangement in which the power supply connection pad or the ground connection pad, connectable to the other of the power supply pad and the ground pad of the sensor chip, is arranged in each of two ends of the sensor connection pad are adopted.

According to this configuration, in each of a case of adopting the side-by-side structure in which the sensor chip is arranged lateral to the processing circuit chip and a case of adopting the chip stack structure in which the sensor chip is mounted on the processing circuit chip, it is possible to realize without changing the pad arrangement of the sensor chip or the processing circuit chip and remanufacturing it. In other words, it becomes possible to adapt to both the side-by-side structure and the chip stack structure. In addition, it is possible to reduce a cost related to a modification to the sensor chip or the processing circuit chip.

BRIEF DESCRIPTION OF THE DRAWINGS

FIG. 2 is a perspective view of a sensor module of the first embodiment of the present invention and is a perspective view when a sealing resin of the sensor module having a chip stack structure is made partially transparent;

FIG. 3 is an explanatory diagram illustrating a sensor chip of the first embodiment;

FIG. 7 is a perspective view of a sensor module of the second embodiment of the present invention and is a perspective view when a sealing resin of the sensor module having the chip stack structure is made partially transparent;

FIG. 14 is a plan view when the sealing resin of the sensor module having the chip stack structure of the third embodiment is made partially transparent;

DESCRIPTION OF THE EXEMPLARY EMBODIMENTS

Hereinafter, embodiments of the present invention will be described in detail by using drawings. Note that in order to be easily understood, drawings are arbitrarily changed in dimension.

First Embodiment

Figure 1:
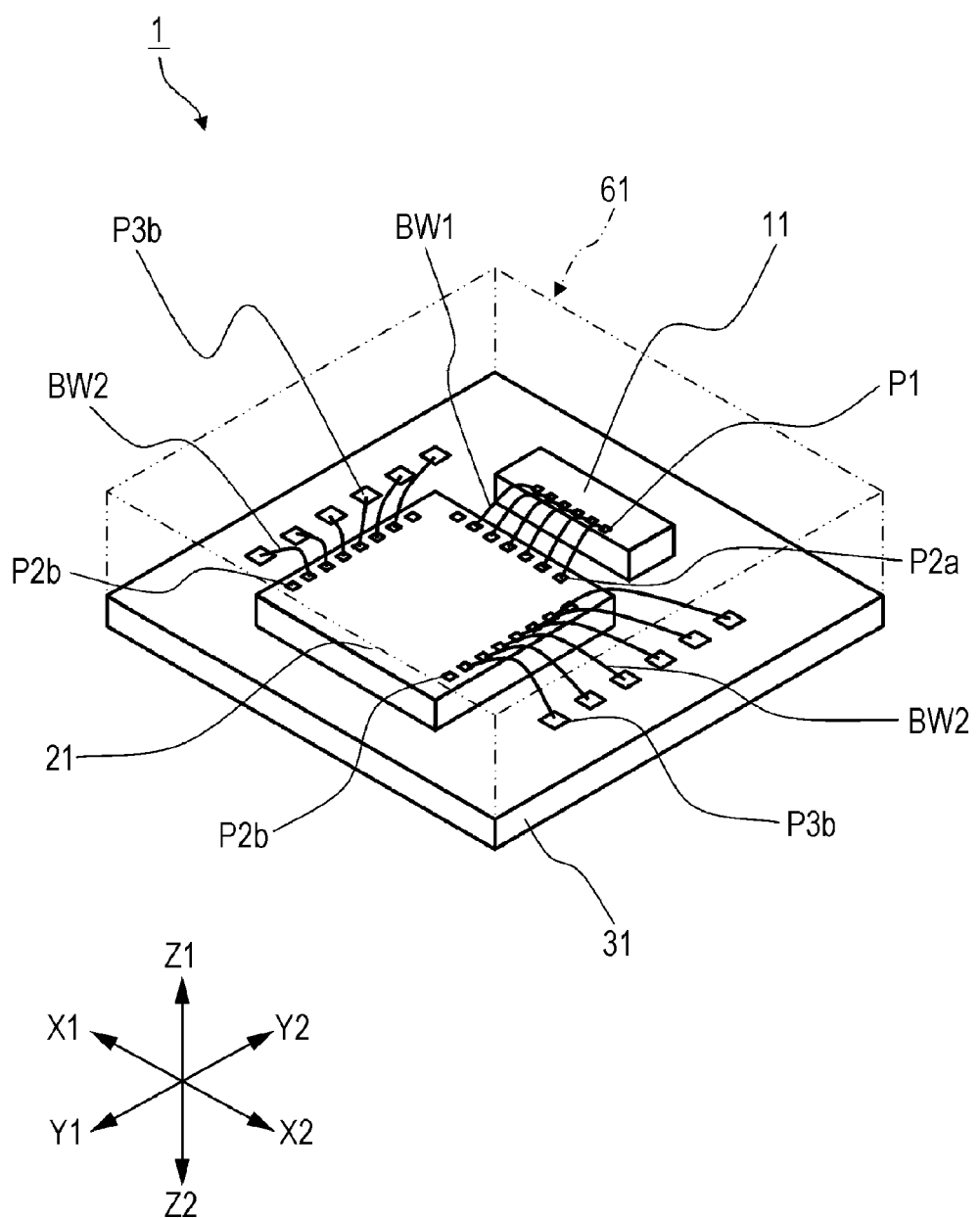
FIG. 1 is a perspective view of a sensor module of a first embodiment of the present invention and is a perspective view when a sealing resin of the sensor module having a side-by-side structure is made partially transparent.
Figure 4:
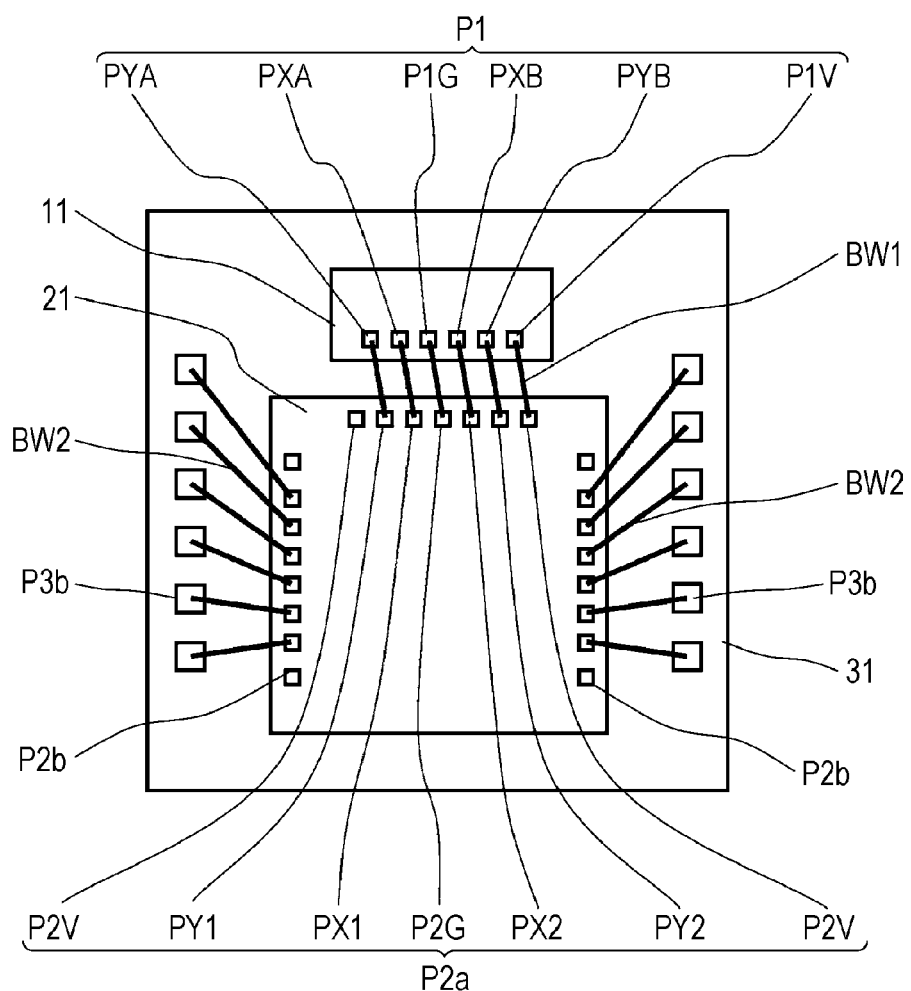
FIG. 4 is a plan view when the sealing resin of the sensor module having the side-by-side structure of the first embodiment is made partially transparent.
Figure 5:
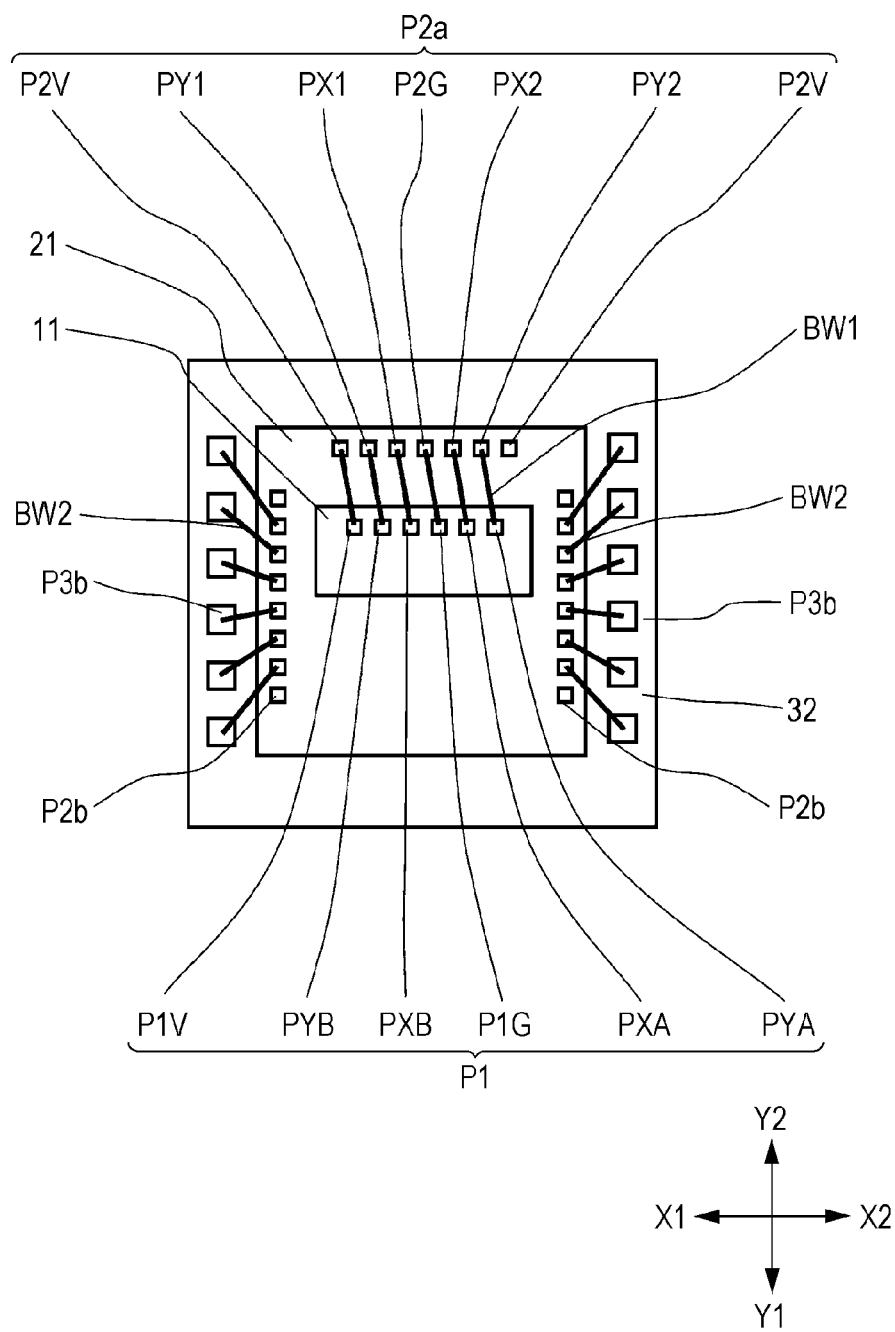
FIG. 5 is a plan view when the sealing resin of the sensor module having the chip stack structure of the first embodiment is made partially transparent.

FIG. 1 is a perspective view of a sensor module 1 of a first embodiment of the present invention and is a perspective view when a sealing resin 61 of the sensor module 1 having a side-by-side structure is made partially transparent. FIG. 2 is a perspective view of a sensor module 2 of the first embodiment of the present invention and is a perspective view when a sealing resin 62 of the sensor module 2 having a chip stack structure is made partially transparent. FIG. 3 is an explanatory diagram illustrating a sensor chip 11 of the first embodiment. FIG. 4 is a plan view when the sealing resin 61 of the sensor module 1 having the side-by-side structure is made partially transparent. FIG. 5 is a plan view when the sealing resin 62 of the sensor module 2 having the chip stack structure is made partially transparent.

The sensor module 1 illustrated in FIG. 1 and the sensor module 2 illustrated in FIG. 2 each configure a sensor whose sensing target is an external physical quantity. As illustrated in each of FIG. 1 and FIG. 2, a module in which chips (the sensor chip 11 and a processing circuit chip 21 in the present embodiment) are arranged is called a multichip module. A structure in which chips are two-dimensionally arranged as illustrated in FIG. 1 is called the side-by-side structure, and a structure in which chips are stacked and arranged as illustrated in FIG. 2 is called the chip stack structure.

As illustrated in FIG. 3, the sensor chip 11 may include an X sensor element 11X and a Y sensor element 11Y, which are embedded therein and each detect by using a differential type, and may include sensor pads P1 connected by wiring lines. Since the X sensor element 11X and the Y sensor element 11Y each have a specific sensitivity axis direction, detection axis directions change as respective physical quantity sensors, depending on an arrangement direction of the sensor chip 11. In the specification, the term "arrangement direction" is expressed by using, for example, coordinates illustrated in FIG. 1.

In FIG. 1, in the sensor module 1, a wiring substrate 31 may be connected and arranged so that the sensor chip 11 is located on a Y2 side and the processing circuit chip 21 is located on a Y1 side on a plane surface orthogonal to a Z1-Z2 direction. In a case of being arranged as illustrated in FIG. 1, the X sensor element 11X illustrated in FIG. 3 may be a physical quantity sensor that has a sensitivity axis in an X1-X2 direction and that detects a specific physical quantity in a direction headed from an X1 side to an X2 side. In a case of being arranged as illustrated in FIG. 1, the Y sensor element 11Y illustrated in FIG. 3 may be a physical quantity sensor that has a sensitivity axis in an Y1-Y2 direction and that detects a specific physical quantity in a direction headed from the Y1 side to the Y2 side. On the other hand, in a case of being arranged as illustrated in FIG. 2, since the sensitivity axis directions are rotated by 180 degrees, physical quantities in respective directions headed from the X2 side to the X1 side and headed from the Y2 side to the Y1 side are detected.

Examples of a physical quantity sensor whose detection axis direction changes, depending on an arrangement direction, in this way include, for example, a magnetic sensor, an acceleration sensor, an angular velocity sensor, and so forth that each have detection axis directions corresponding to two axes. In the present embodiment, a case example in which an output voltage is obtained from a bridge circuit utilizing resistance type detection elements whose resistance values each change in accordance with a detection value in a sensitivity axis direction will be described. Usually, the sensitivity axis directions of the detection elements correspond to detection axis directions in a case of configuring a sensor module.

The processing circuit chip 21 converts, into a desired electric signal, and outputs a signal input by the sensor chip 11. In the present embodiment, each of the processing circuit chip 21 and the sensor chip 11 is a bare chip diced after forming integrated circuits on a silicon wafer. The processing circuit chip 21 includes an amplifier circuit that amplifies a differential input and that is called a differential amplifier. Note that the sensor chip 11 or the processing circuit chip 21 does not have to be a bare chip and may be in a state of being housed alone in a package. A structure of a module in that case is called a multiple package in some cases.

The sensor chip 11 of the sensor module 1 has a back surface on a Z2 side, fixed to the wiring substrate 31 by using an adhesive material, and may include the sensor pads P1 for wire bonding, provided on a surface on a Z1 side thereof. The processing circuit chip 21 has a back surface on the Z2 side, fixed to the wiring substrate 31 by using an adhesive material, and may include sensor connection pads P2a and substrate connection pads P2b, used for wire bonding and provided on a surface on the Z1 side thereof. In addition, the wiring substrate 31 may include terminal portions P3b for wire bonding, provided on a surface on the Z1 side thereof. The sensor pads P1 and the sensor connection pads P2a, used for wire bonding, are electrically connected to each other via respective bonding wires BW1. Furthermore, the substrate connection pads P2b of the processing circuit chip 21 and the terminal portions P3b of the wiring substrate 31 are electrically connected to each other via respective bonding wires BW2.

The processing circuit chip 21 of the sensor module 2 has a back surface on the Z2 side, fixed to a wiring substrate 32 by using an adhesive material, and may include the sensor connection pads P2a and the substrate connection pads P2b, used for wire bonding and provided on a surface on the Z1 side thereof. In addition, the sensor chip 11 of the sensor module 2 has a back surface on the Z2 side, fixed to the processing circuit chip 21 by using an adhesive material, and may include the sensor pads P1 for wire bonding, provided on a surface on the Z1 side thereof. In addition, the wiring substrate 32 may include the terminal portions P3b for wire bonding, provided on a surface on the Z1 side. The sensor pads P1 and the sensor connection pads P2a, used for wire bonding, are electrically connected to each other via the respective bonding wires BW1. Furthermore, the substrate connection pads P2b of the processing circuit chip 21 and the terminal portions P3b of the wiring substrate 32 are electrically connected to each other via the respective bonding wires BW2.

Next, a characterizing portion in which the sensor pads P1 and the sensor connection pads P2a are arranged in the present embodiment will be described in detail.

In order to be connected to the sensor connection pads P2a of the processing circuit chip 21 by using the bonding wires BW1, the sensor pads P1 of the sensor chip 11 may be arranged so as to face one side of the outer circumference of the sensor chip 11 and may be arrayed in a row along the side. As illustrated in FIG. 3 to FIG. 5, the sensor pads P1 may include a power supply pad P1V, a ground pad P1G, and two sets of differential detection signal pads PXA, PXB, PYA, and PYB. The differential detection signal pads PXA and PXB may be arranged on both sides of the ground pad P1G, the differential detection signal pads PYA and PYB may be arranged on both sides thereof, and furthermore, the power supply pad P1V may be arranged in one end (on Y+ side) of two ends of the sensor pads P1b. In other words, centered at the ground pad P1G, the differential detection signal pads PXA and PXB, which serve as one of the two sets, may be bilaterally symmetrically arranged, and the differential detection signal pads PYA and PYB, which serve as the other of the two sets, may be bilaterally symmetrically arranged.

The sensor connection pads P2a of the processing circuit chip 21 may be arrayed in a row along a side of the processing circuit chip 21, which faces the one side of the outer circumference of the sensor chip 11. The substrate connection pads P2b may be arrayed along sides different from the side in which the sensor connection pads P2a are arranged. In the present embodiment, the substrate connection pads P2b may be arrayed in two rows on the X1 side and the X2 side.

As illustrated in FIG. 4, the sensor connection pads P2a of the processing circuit chip 21 may include power supply connection pads P2V, a ground connection pad P2G, and two sets of differential detection signal connection pads PX1, PX2, PY1, and PY2. So as to correspond to the power supply pad P1V, the ground pad P1G, and the two sets of the differential detection signal pads PXA, PXB, PYA, and PYB of the sensor chip 11, the differential detection signal connection pads PX1 and PX2 may be symmetrically arranged on both sides of the ground connection pad P2G, the differential detection signal connection pads PY1 and PY2 may be symmetrically arranged on both sides thereof, and furthermore, the power supply connection pads P2V may be arranged at two points serving as two ends of the sensor connection pads P2a. In other words, centered at the ground connection pad P2G, the differential detection signal connection pads PX1 and PX2, which serve as one of the two sets, may be bilaterally symmetrically arranged, the differential detection signal connection pads PY1 and PY2, which serve as the other of the two sets, may be bilaterally symmetrically arranged, and the power supply connection pads P2V located at the two points may be bilaterally symmetrically arranged. As illustrated in FIG. 4, while one point (on the X2 side) of the two points of the power supply connection pads P2V is connected to the power supply pad P1V of the sensor chip 11 via one of the bonding wires BW1, the other point (on the X1 side) is not connected.

As illustrated in FIG. 5, in the sensor module 2 having the chip stack structure, the above-mentioned sensor chip 11 is stacked and arranged on the processing circuit chip 21, and the module outer shape thereof is further miniaturized. Specifically, the dimension of the wiring substrate 32 is smaller than the dimension of the wiring substrate 31. In the sensor module 2 that has the chip stack structure and that is illustrated in FIG. 5, the arrangement direction of the sensor chip 11 is different from that in FIG. 4 so that the sensor pads P1 are able to be put closer to the sensor connection pads P2a.

Usually, it is difficult for bonding wires to be provided so as to intersect with each other, and a trouble such as making contact with each other and being electrically short-circuited is easily caused. Therefore, as illustrated in FIG. 4 and FIG. 5, the bonding wires BW1 adjacent to each other are provided so as to be in parallel to each other. In FIG. 5, the arrangement direction of the sensor chip 11 is different from that in FIG. 4. Therefore, it is difficult to connect the differential detection signal pad PXA and the differential detection signal connection pad PX1 to each other, and the differential detection signal pad PXA is connected to the differential detection signal connection pad PX2. In the same way, the differential detection signal pad PXB is connected to the differential detection signal connection pad PX1, the differential detection signal pad PYA is connected to the differential detection signal connection pad PY2, and the differential detection signal pad PYB is connected to the differential detection signal connection pad PY1.

The ground pad P1G is connected to the ground connection pad P2G, and as described above, the power supply pad P1V is connected to one point (on the X2 side) of the two points of the power supply connection pads P2V.

In this way, the power supply pad P1V and the ground pad P1G of the sensor chip 11 are connected to the processing circuit chip 21 in the same state in the arrangement of each of the side-by-side structure and the chip stack structure. On the other hand, depending on the arrangement, the differential detection signal connection pads PX1 and PX2 are replaced with each other and connected to the differential detection signal pads PXA and PXB, the differential detection signal connection pads PY1 and PY2 are replaced with each other and connected to the differential detection signal pads PYA and PYB in the same way, and polarities turn out to be changed. However, since the arrangement of the sensor chip 11 is different, sensitivity axis directions are rotated by 180 degrees, and the directions of detected physical quantities are different by 180 degrees. Therefore, the differential detection signal connection pads PX1 and PX2 are replaced with each other and the differential detection signal connection pads PY1 and PY2 are replaced with each other, thereby putting detection axis directions into the same states at a time of converting into electric signals in the processing circuit chip 21 and outputting. Accordingly, while the sensor chip 11 or the processing circuit chip 21 is not changed and a special circuit is not added to the processing circuit chip 21, it is possible to detect physical quantities serving as targets, in the same states in the arrangement of each of the side-by-side structure and the chip stack structure.

Hereinafter, advantages obtained by adopting the present embodiment will be described.

The sensor modules 1 and 2 of the present embodiment may each incorporate the sensor chip 11, in which the X sensor element 11X and the Y sensor element 11Y to detect by using differential types are embedded, and the processing circuit chip 21 to process differential detection signals from the sensor chip 11. In the sensor chip 11, the X sensor element 11X and the Y sensor element 11Y, which have respective sensitivity axes orthogonal to each other, may be embedded. The sensor chip 11 may include the sensor pads P1 arranged so as to face the outer circumference thereof, and the sensor pads P1 may include the power supply pad P1V, the ground pad P1G, and the two sets of the differential detection signal pads PXA, PXB, PYA, and PYB. The first set of the differential detection signal pads PXA and PXB may be symmetrically arranged on both sides of the ground pad P1G and are centered at the ground pad P1G, the second set of the differential detection signal pads PYA and PYB may be arranged on both sides of the first set, and the power supply pad P1V may be arranged in one end of the two ends of the sensor pads P1. So as to correspond to the power supply pad P1V, the ground pad P1G, and the two sets of the differential detection signal pads PXA, PXB, PYA, and PYB of the sensor chip 11, the processing circuit chip 21 may include the sensor connection pads P2a including the power supply connection pads P2V, the ground connection pad P2G, and the two sets of the differential detection signal connection pads PX1, PX2, PY1, and PY2. Furthermore, the power supply connection pads P2V connectable to the power supply pad P1V of the sensor chip 11 may be arranged in the two ends of the sensor connection pads P2a.

According to this configuration, in each of a case of adopting the side-by-side structure and a case of adopting the chip stack structure, it becomes possible to realize the sensor modules 1 and 2 without changing the pad arrangement of the sensor chip 11 or the processing circuit chip 21 and remanufacturing it. In addition, in a case of a physical quantity sensor whose sensitivity axis direction may be parallel to the surface of the sensor chip 11, the polarity of an output of the processing circuit chip 21 is not different between a case of adopting the side-by-side structure and a case of adopting the chip stack structure. Therefore, it is not necessary to configure, in the processing circuit chip 21, a unit to switch a polarity. Accordingly, it is possible to reduce a cost related to it.

In addition, the processing circuit chip 21 of the present embodiment processes differential detection signals of the differential type sensor chip 11 in which the X sensor element 11X and Y sensor element 11Y to detect by using differential types are embedded, and may include the sensor connection pads P2a arranged so as to face the outer circumference of the sensor chip 11, the sensor connection pads P2a may include the power supply connection pads P2V, the ground connection pad P2G, and the two sets of the differential detection signal connection pads PX1, PX2, PY1, and PY2, the differential detection signal connection pads PX1, PX2, PY1, and PY2 may be arranged on both sides of the ground connection pad P2G, and the power supply connection pads P2V may be arranged in the two ends of the sensor connection pads P2a.

According to this configuration, in each of a case of adopting the side-by-side structure in which the sensor chip 11 is arranged lateral to the processing circuit chip 21 and a case of adopting the chip stack structure in which the sensor chip 11 is mounted on the processing circuit chip 21, it becomes possible to realize without changing the pad arrangement of the sensor chip 11 or the processing circuit chip 21 and remanufacturing it. In addition, it is possible to reduce a cost related to a modification to the sensor chip 11 or the processing circuit chip 21.

Second Embodiment

Figure 6:
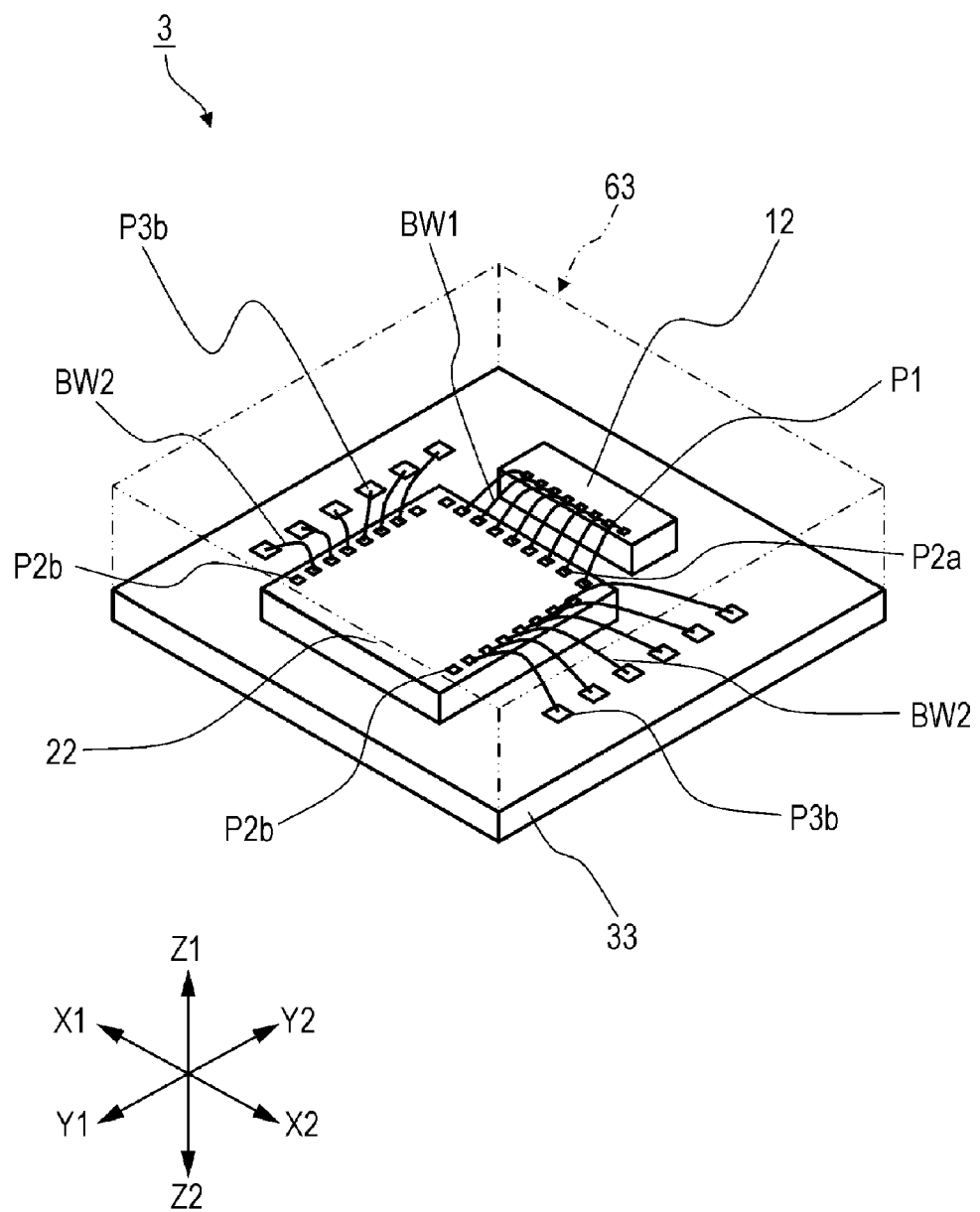
FIG. 6 is a perspective view of a sensor module of a second embodiment of the present invention and is a perspective view when a sealing resin of the sensor module having the side-by-side structure is made partially transparent.
Figure 8:
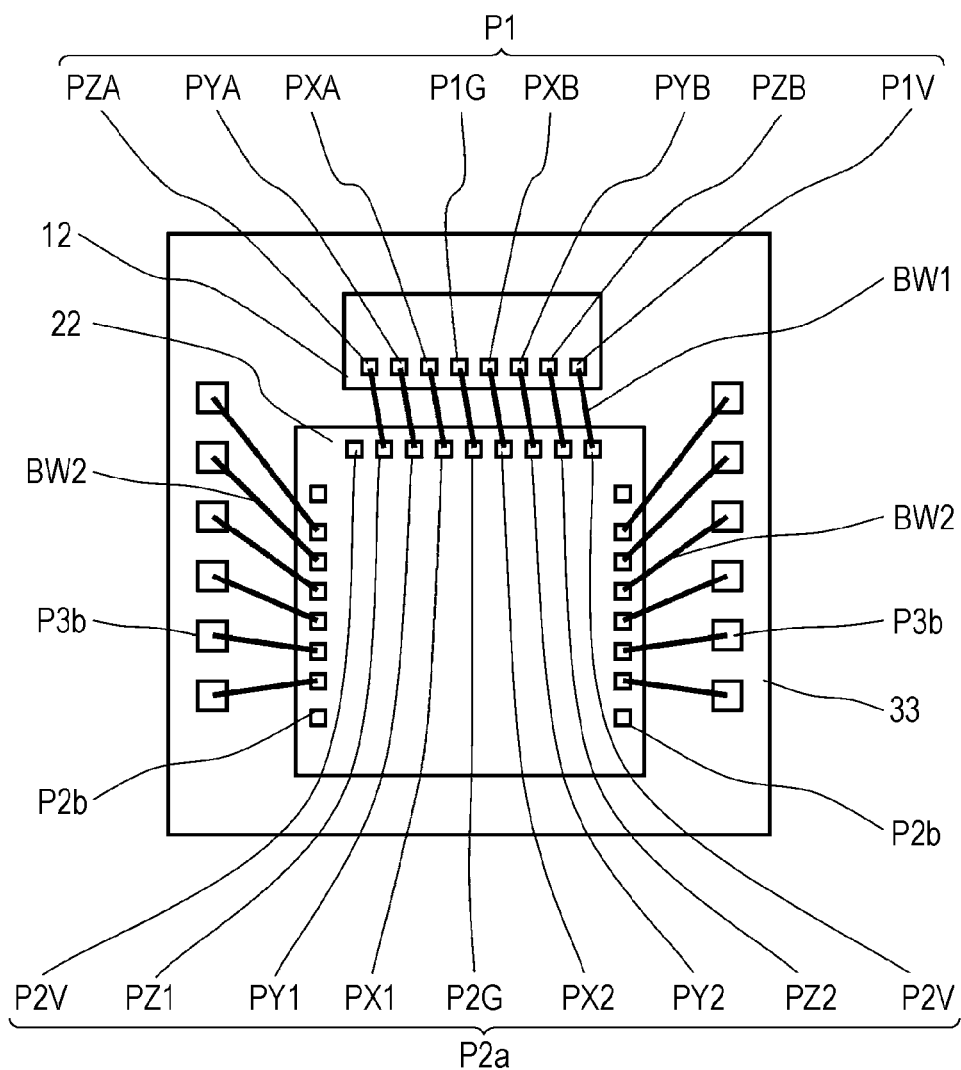
FIG. 8 is a plan view when the sealing resin of the sensor module having the side-by-side structure of the second embodiment is made partially transparent.
Figure 9:
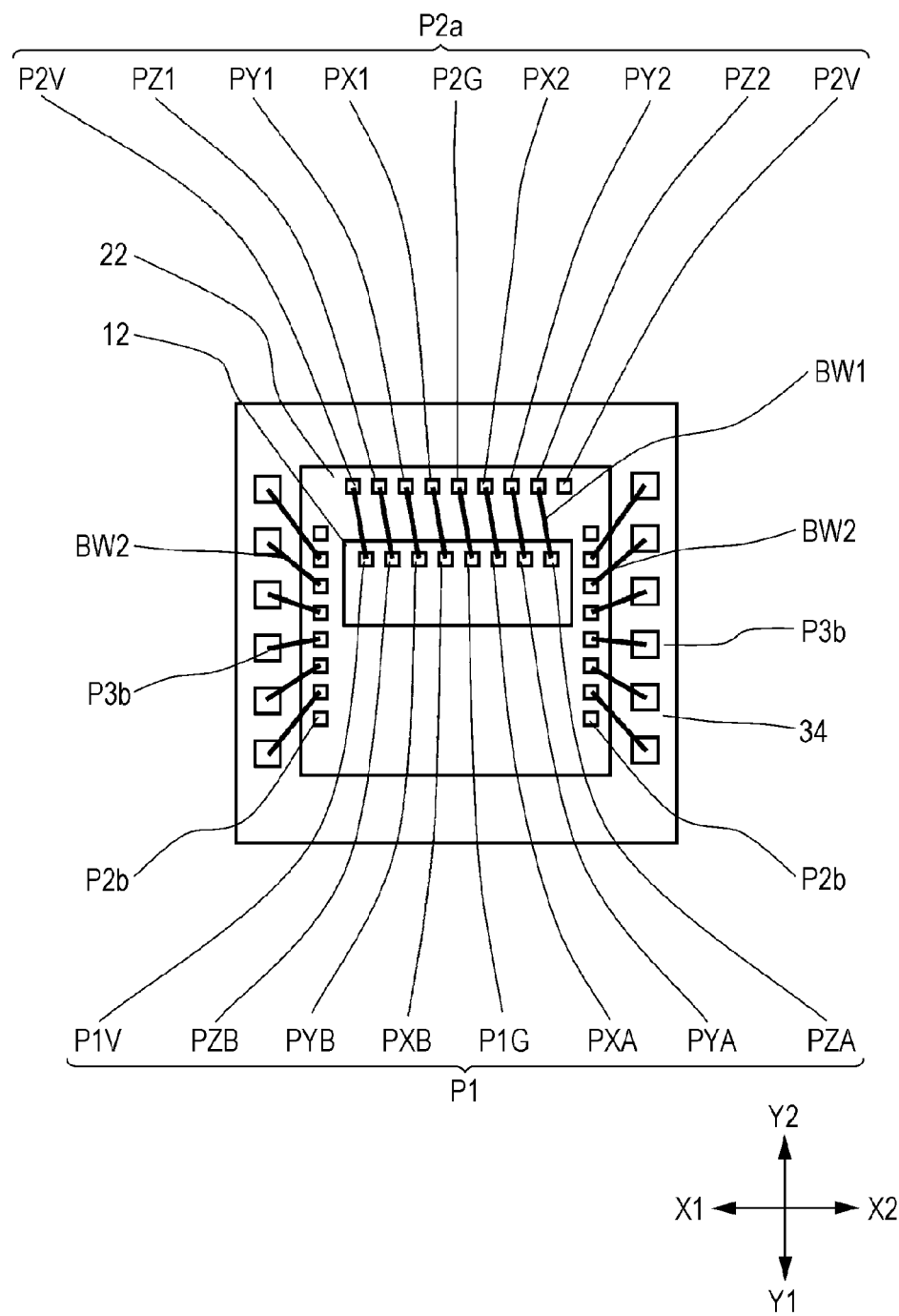
FIG. 9 is a plan view when the sealing resin of the sensor module having the chip stack structure of the second embodiment is made partially transparent.
Figure 10:
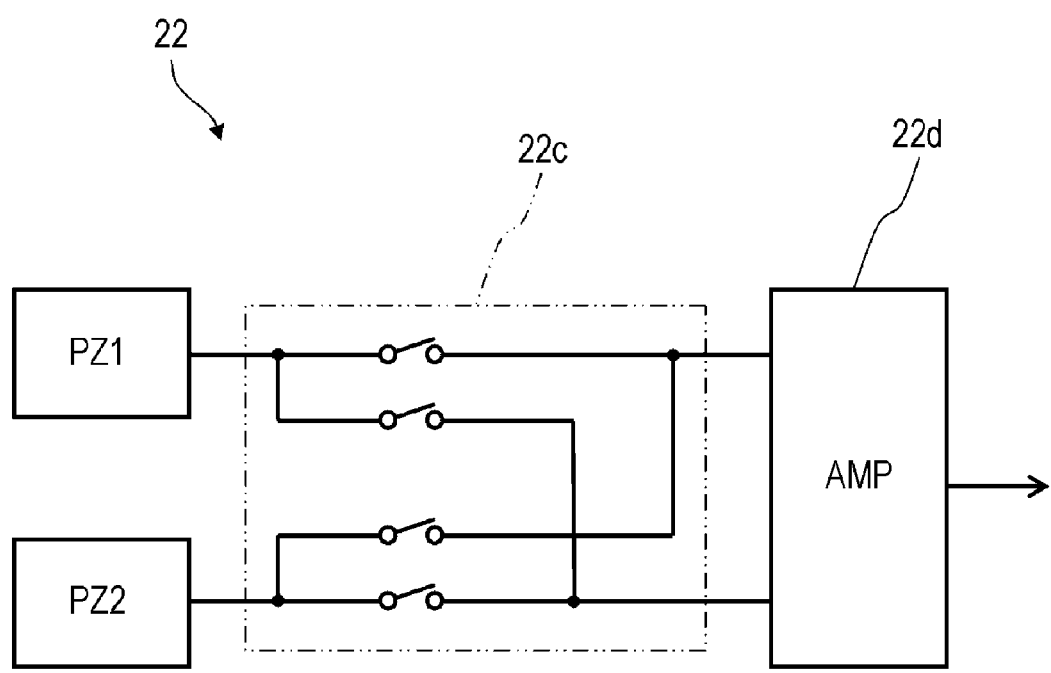
FIG. 10 is a circuit diagram illustrating a polarity switching unit included in a processing circuit chip of the second embodiment.

FIG. 6 is a perspective view of a sensor module 3 of a second embodiment of the present invention and is a perspective view when a sealing resin 63 of the sensor module 3 having a side-by-side structure is made partially transparent. FIG. 7 is a perspective view of a sensor module 4 of the second embodiment of the present invention and is a perspective view when a sealing resin 64 of the sensor module 4 having a chip stack structure is made partially transparent. FIG. 8 is a plan view when the sealing resin 63 of the sensor module 3 having the side-by-side structure of the second embodiment is made partially transparent. FIG. 9 is a plan view when the sealing resin 64 of the sensor module 4 having the chip stack structure of the second embodiment is made partially transparent. FIG. 10 is a circuit diagram illustrating a polarity switching unit 22c that a processing circuit chip 22 of the second embodiment may include.

The sensor module 3 illustrated in FIG. 6 and the sensor module 4 illustrated in FIG. 7 each configure a three-axis sensor whose sensing target is an external physical quantity. As illustrated in each of FIG. 6 and FIG. 7, a multichip module in which a sensor chip 12 and the processing circuit chip 22 are arranged is adopted. A structure in which chips are two-dimensionally arranged as illustrated in FIG. 6 is called the side-by-side structure, and a structure in which chips are stacked and arranged as illustrated in FIG. 7 is called the chip stack structure.

The sensor chip 12 may include an X sensor element 12X, a Y sensor element 11Y, and a Z sensor element 12Z, which are embedded therein and each detect by using a differential type. Since the X sensor element 11X, the Y sensor element 11Y, and the Z sensor element 12Z each have a specific sensitivity axis direction, detection axis directions change as respective physical quantity sensors, depending on an arrangement direction of the sensor chip 12.

In FIG. 6, in the sensor module 3, a wiring substrate 33 may be connected and arranged so that the sensor chip 12 is located on the Y2 side and the processing circuit chip 22 is located on the Y1 side on a plane surface orthogonal to the Z1-Z2 direction. In a case of being arranged as illustrated in FIG. 6, the X sensor element 12X may be a physical quantity sensor that has a sensitivity axis in the X1-X2 direction and that detects a specific physical quantity in a direction headed from the X1 side to the X2 side. In a case of being arranged as illustrated in FIG. 6, the Y sensor element 12Y may be a physical quantity sensor that has a sensitivity axis in the Y1-Y2 direction and that detects a specific physical quantity in a direction headed from the Y1 side to the Y2 side. On the other hand, in a case of being arranged as illustrated in FIG. 7, the sensitivity axis directions are rotated by 180 degrees, physical quantities in respective directions headed from the X2 side to the X1 side and headed from the Y2 side to the Y1 side are detected. In the arrangements illustrated in FIG. 6 and FIG. 7, the Z sensor element 12Z may be a physical quantity sensor that has a sensitivity axis in the Z1-Z2 direction and that detects a specific physical quantity in a direction headed from the Z1 side to the Z2 side.

In this way, the physical quantity sensors whose detection axis directions are each rotated by 180 degrees between the side-by-side structure in FIG. 6 and the chip stack structure in FIG. 7 and the physical quantity sensor whose detection axis direction is not changed therebetween are integrally embedded in the sensor chip 12.

The processing circuit chip 22 converts, into a desired electric signal, and outputs a signal input by the sensor chip 12. In the present embodiment, each of the processing circuit chip 22 and the sensor chip 12 is a bare chip diced after forming integrated circuits on a silicon wafer. As illustrated in FIG. 10, the processing circuit chip 22 includes an amplifier circuit 22d that amplifies a differential input and that is called a differential amplifier.

Furthermore, the processing circuit chip 22 may include the polarity switching unit 22c that switches the polarity of a signal input by the Z sensor element 12Z and that is located in a stage previous to the amplifier circuit 22d. Specifically, as illustrated in FIG. 10, the polarity switching unit 22c may be configured by a circuit to switch wiring lines by using switches.

The sensor chip 12 of the sensor module 3 has a back surface on the Z2 side, fixed to the wiring substrate 33 by using an adhesive material, and may include sensor pads P1 for wire bonding, provided on a surface on the Z1 side thereof. The processing circuit chip 22 has a back surface on the Z2 side, fixed to the wiring substrate 33 by using an adhesive material, and may include sensor connection pads P2a and the substrate connection pads P2b, used for wire bonding and provided on a surface on the Z1 side thereof. In addition, the wiring substrate 33 includes the terminal portions P3b for wire bonding, provided on a surface on the Z1 side. The sensor pads P1 and the sensor connection pads P2a, used for wire bonding, are electrically connected to each other via respective bonding wires BW1. Furthermore, the substrate connection pads P2b of the processing circuit chip 22 and the terminal portions P3b of the wiring substrate 33 are electrically connected to each other via the respective bonding wires BW2.

The processing circuit chip 22 of the sensor module 4 has a back surface on the Z2 side, fixed to a wiring substrate 34 by using an adhesive material, and may include the sensor connection pads P2a and the substrate connection pads P2b, used for wire bonding and provided on the surface on the Z1 side thereof. The sensor chip 12 of the sensor module 4 has a back surface on the Z2 side, fixed to the processing circuit chip 22 by using an adhesive material, and may include the sensor pads P1 for wire bonding, provided on a surface on the Z1 side thereof. In addition, the wiring substrate 34 includes the terminal portions P3b for wire bonding, provided on a surface on the Z1 side. The sensor pads P1 and the sensor connection pads P2a, used for wire bonding, are electrically connected to each other via the respective bonding wires BW1. Furthermore, the substrate connection pads P2b of the processing circuit chip 22 and the terminal portions P3b of the wiring substrate 34 are electrically connected to each other via the respective bonding wires BW2.

Next, a characterizing portion in which the sensor pads P1 and the sensor connection pads P2a are arranged in the present embodiment will be described in detail.

In order to be connected to the sensor connection pads P2a of the processing circuit chip 22 by using the bonding wires BW1, the sensor pads P1 of the sensor chip 12 may be arranged so as to face one side of the outer circumference of the sensor chip 12 and may be arrayed in a row along the side. As illustrated in FIG. 8 and FIG. 9, the sensor pads P1 may include the power supply pad P1V, the ground pad P1G, and three sets of differential detection signal pads PXA, PXB, PYA, PYB, PZA, and PZB. The differential detection signal pads PXA and PXB may be arranged on both sides of the ground pad P1G, the differential detection signal pads PYA and PYB may be arranged on both sides thereof, the differential detection signal pads PZA and PZB may be further arranged on both sides thereof, and furthermore, the power supply pad P1V may be arranged in one end (on a Y+ side) of two ends of the sensor pads P1b.

The sensor connection pads P2a of the processing circuit chip 22 may be arrayed in a row along a side of the processing circuit chip 22, which faces the one side of the outer circumference of the sensor chip 12. The substrate connection pads P2b may be arrayed along sides different from the side in which the sensor connection pads P2a are arranged. In the present embodiment, the substrate connection pads P2b may be arrayed in two rows on the X1 side and the X2 side.

As illustrated in FIG. 8, the sensor connection pads P2a of the processing circuit chip 22 may include the power supply connection pads P2V, the ground connection pad P2G, and three sets of differential detection signal connection pads PX1, PX2, PY1, PY2, PZ1, and PZ2. So as to correspond to the power supply pad P1V, the ground pad P1G, and the three sets of the differential detection signal pads PXA, PXB, PYA, PYB, PZA, and PZB of the sensor chip 12, the differential detection signal connection pads PX1 and PX2 may be symmetrically arranged on both sides of the ground connection pad P2G, the differential detection signal connection pads PY1 and PY2 may be symmetrically arranged on both sides thereof, the differential detection signal connection pads PZ1 and PZ2 may be further arranged symmetrically on both sides thereof, and furthermore, the power supply connection pads P2V may be arranged at two points serving as two ends of the sensor connection pads P2a. As illustrated in FIG. 8, while one point (on the X2 side) of the two points of the power supply connection pads P2V is connected to the power supply pad P1V of the sensor chip 12 via one of the bonding wires BW1, the other point (on the X1 side) is not connected.

As illustrated in FIG. 9, in the sensor module 4 having the chip stack structure, the above-mentioned sensor chip 12 is stacked and arranged on the processing circuit chip 22, and the module outer shape thereof is further miniaturized. The arrangement direction of the sensor chip 12 is different from that in FIG. 8 so that the sensor pads P1 illustrated in FIG. 9 are able to be put closer to the sensor connection pads P2a.

Usually, it is difficult for bonding wires to be provided so as to intersect with each other, and a trouble such as making contact with each other and being electrically short-circuited is easily caused. Therefore, as illustrated in FIG. 8 and FIG. 9, the bonding wires BW1 adjacent to each other are provided so as to be in parallel to each other. In FIG. 9, the arrangement direction of the sensor chip 12 is different from that in FIG. 8. Therefore, it is difficult to connect the differential detection signal pad PXA and the differential detection signal connection pad PX1 to each other, and the differential detection signal pad PXA is connected to the differential detection signal connection pad PX2. In the same way, the differential detection signal pad PXB is connected to the differential detection signal connection pad PX1, the differential detection signal pad PYA is connected to the differential detection signal connection pad PY2, the differential detection signal pad PYB is connected to the differential detection signal connection pad PY1, the differential detection signal pad PZA is connected to the differential detection signal connection pad PZ2, and the differential detection signal pad PZB is connected to the differential detection signal connection pad PZ1.

The ground pad P1G is connected to the ground connection pad P2G, and as described above, the power supply pad P1V is connected to one point (on the X2 side) of the two points of the power supply connection pads P2V.

In this way, the power supply pad P1V and the ground pad P1G of the sensor chip 12 are connected to the processing circuit chip 22 in the same state in the arrangement of each of the side-by-side structure and the chip stack structure. On the other hand, depending on the arrangement, the differential detection signal connection pads PX1 and PX2 are replaced with each other and connected to the differential detection signal pads PXA and PXB, the differential detection signal connection pads PY1 and PY2 are replaced with each other and connected to the differential detection signal pads PYA and PYB in the same way, and polarities turn out to be changed. However, since the arrangement of the sensor chip 12 is different, sensitivity axis directions are rotated by 180 degrees, and the directions of detected physical quantities are different by 180 degrees. Therefore, the differential detection signal connection pads PX1 and PX2 are replaced with each other and the differential detection signal connection pads PY1 and PY2 are replaced with each other, thereby putting detection axis directions into the same states at a time of converting into electric signals in the processing circuit chip 22 and outputting.

On the other hand, the differential detection signal pad PZA having the chip stack structure illustrated in FIG. 9 is connected to the differential detection signal connection pad PZ2, and the differential detection signal pad PZB is connected to the differential detection signal connection pad PZ1. However, in the arrangement of each of the side-by-side structure and the chip stack structure, sensitivity axis directions do not change. Therefore, this just switches the direction of a physical quantity to be detected, and the polarity thereof change. However, as illustrated in FIG. 10, the polarity switching unit 22c is configured. Therefore, by switching wiring lines by use of switches, it is possible to put the direction of a physical quantity serving as a target into the same desired state.

Accordingly, while the sensor chip 12 or the processing circuit chip 22 is not changed, it is possible to detect physical quantities serving as targets, in the same states in the arrangement of each of the side-by-side structure and the chip stack structure.

Hereinafter, advantages obtained by adopting the present embodiment will be described.

The sensor modules 3 and 4 of the present embodiment may each incorporate the sensor chip 12, in which the X sensor element 12X, the Y sensor element 12Y, and the Z sensor element 12Z to detect by using differential types are embedded, and the processing circuit chip 22 to process differential detection signals of the sensor chip 12. The sensor chip 12 may include the sensor pads P1 arranged so as to face the outer circumference thereof, and the sensor pads P1 may include the power supply pad P1V, the ground pad P1 G, and the three sets of the differential detection signal pads PXA, PXB, PYA, PYB, PZA, and PZB. In addition, the differential detection signal pads PXA, PXB, PYA, PYB, PZA, and PZB may be symmetrically arranged on both sides of the ground pad P1 G, and the power supply pad P1V may be arranged in at least one end of the two ends of the sensor pads P1. So as to correspond to the power supply pad P1V, the ground pad P1G, and the three sets of the differential detection signal pads PXA, PXB, PYA, PYB, PZA, and PZB of the sensor chip 12, the processing circuit chip 22 may include the sensor connection pads P2a including the power supply connection pads P2V, the ground connection pad P2G, and the three sets of the differential detection signal connection pads PX1, PX2, PY1, PY2, PZ1, and PZ2. Furthermore, the power supply connection pads P2V connectable to the power supply pad P1V of the sensor chip 12 may be arranged in the two ends of the sensor connection pads P2a.

According to this configuration, in each of a case of adopting the side-by-side structure in which the sensor chip 12 is arranged lateral to the processing circuit chip 22 and a case of adopting the chip stack structure in which the sensor chip 12 is mounted on the processing circuit chip 22, it is possible to realize without changing the pad arrangement of the sensor chip 12 or the processing circuit chip 22 and remanufacturing it. In other words, it becomes possible to adapt to both the side-by-side structure and the chip stack structure. In addition, it is possible to reduce a cost related to a modification to the sensor chip 12 or the processing circuit chip 22.

In addition, in each of the sensor modules 3 and 4 of the present embodiment, the processing circuit chip 22 may include the polarity switching unit 22c to switch the polarity of a signal input by one set of the differential detection signal connection pads PZ1 and PZ2.

According to this configuration, in a case of a physical quantity sensor having whose sensitivity axis direction is different from a sensitivity axis direction parallel to the surface of the sensor chip 12, the polarity of an output of the processing circuit chip 22 changes between a case of adopting the side-by-side structure and a case of adopting the chip stack structure. Therefore, it is only necessary for the polarity switching unit 22c to switch the polarity of the signal. By doing this, in each of a case of adopting the side-by-side structure and a case of adopting the chip stack structure, it becomes possible to realize the sensor modules 3 and 4 without changing the pad arrangement of the sensor chip 12 or the processing circuit chip 22 and remanufacturing it.

In addition, the processing circuit chip 22 of the present embodiment may process differential detection signals of the differential type sensor chip 12 in which the three sets of the X sensor element 12X, Y sensor element 12Y, and Z sensor element 12Z to detect by using differential types are embedded, and may include the sensor connection pads P2a arranged so as to face the outer circumference of the sensor chip 12, the sensor connection pads P2a may include the power supply connection pads P2V, the ground connection pad P2G, and the three sets of the differential detection signal connection pads PX1, PX2, PY1, PY2, PZ1, and PZ2, the three sets of the differential detection signal connection pads PX1, PX2, PY1, PY2, PZ1, and PZ2 may be symmetrically arranged on both sides of the ground connection pad P2G, and the power supply connection pads P2V may be arranged in the two ends of the sensor connection pads P2a. Furthermore, the processing circuit chip 22 may include the polarity switching unit 22c to switch the polarity of the signal input by the pair of differential detection signal connection pads PZ1 and PZ2.

According to this configuration, in a case of a physical quantity sensor whose sensitivity axis direction is different from a sensitivity axis direction parallel to the surface of the sensor chip 12, the polarity of an output of the processing circuit chip 22 changes between a case of adopting the side-by-side structure and a case of adopting the chip stack structure. Therefore, it is only necessary for the polarity switching unit 22c to switch the polarity of the signal. By doing this, in each of a case of adopting the side-by-side structure and a case of adopting the chip stack structure, it becomes possible to realize the sensor modules 3 and 4 without changing the pad arrangement of the sensor chip 12 or the processing circuit chip 22 and remanufacturing it.

Note that while the characteristics of the second embodiment are described by using the sensor modules 3 and 4 each serving as a three-axis sensor module, the present embodiment is not limited to the three-axis sensor module. A single axis sensor module only containing, for example, a Z sensor element may be adopted. In addition, a multi-axis sensor module in which types of physical quantity sensor are integrated may be adopted.

Third Embodiment

Figure 11:
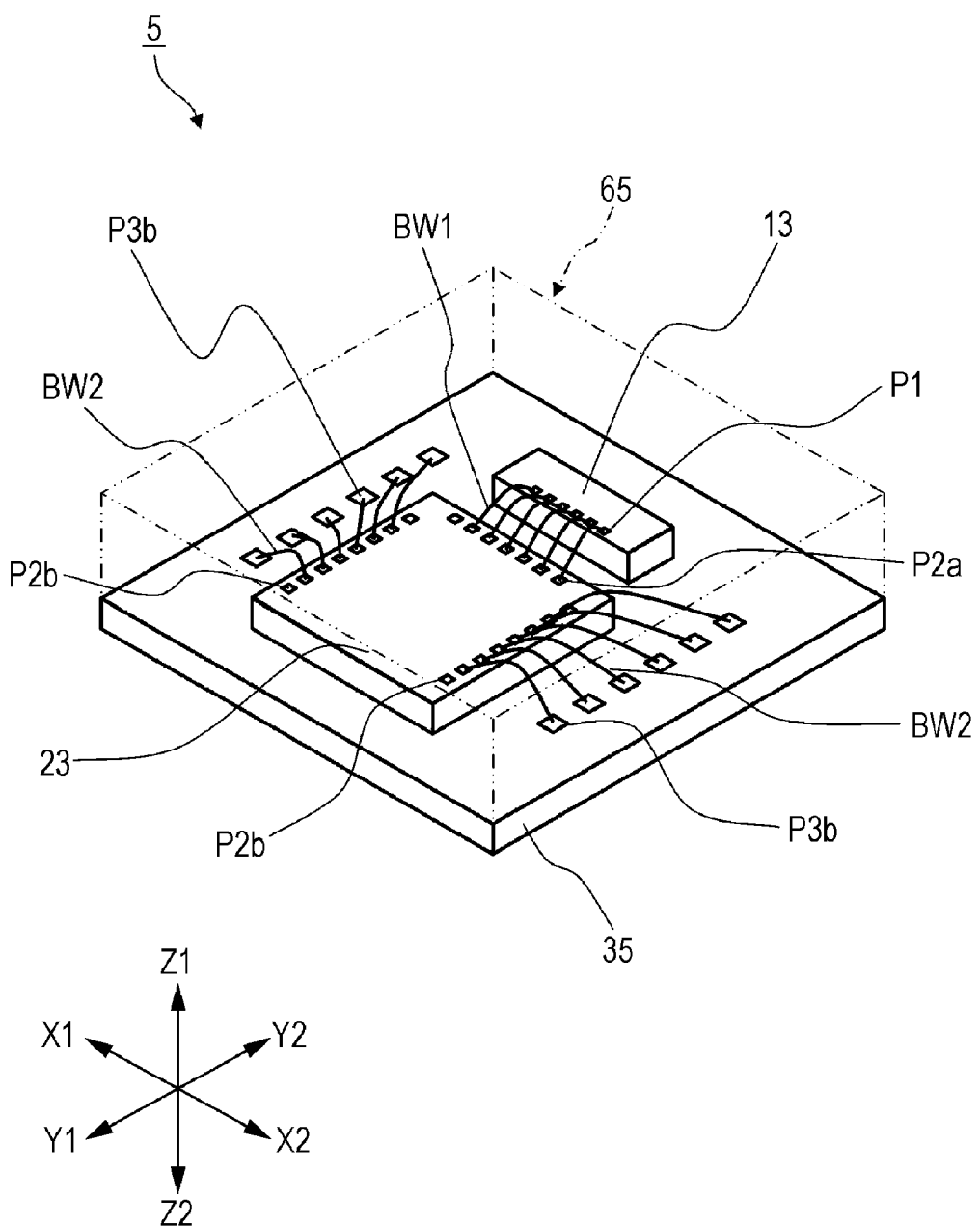
FIG. 11 is a perspective view of a sensor module of a third embodiment of the present invention and is a perspective view when a sealing resin of the sensor module having the side-by-side structure is made partially transparent.
Figure 12:
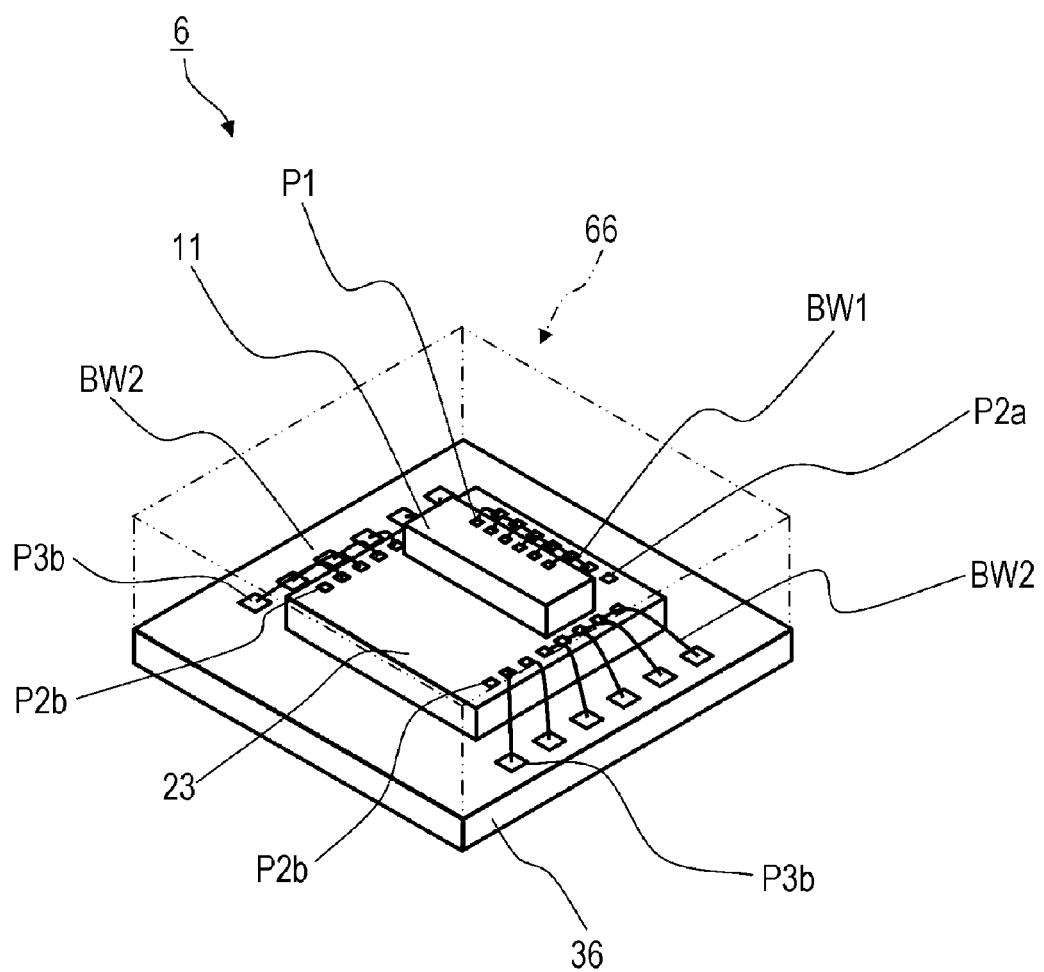
FIG. 12 is a perspective view of a sensor module of the third embodiment of the present invention and is a perspective view when a sealing resin of the sensor module having the chip stack structure is made partially transparent.
Figure 13:
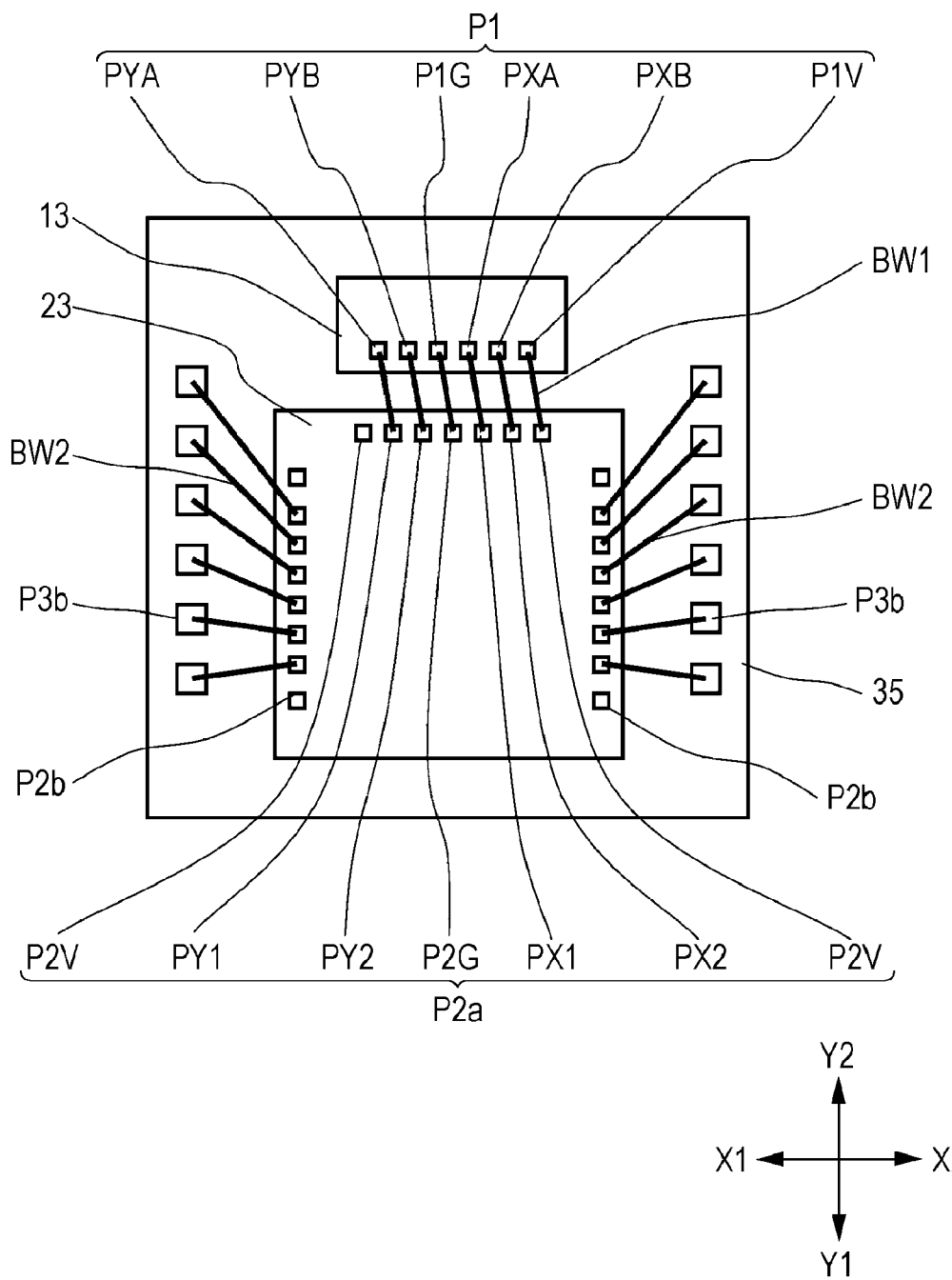
FIG. 13 is a plan view when the sealing resin of the sensor module having the side-by-side structure of the third embodiment is made partially transparent.
Figure 15:
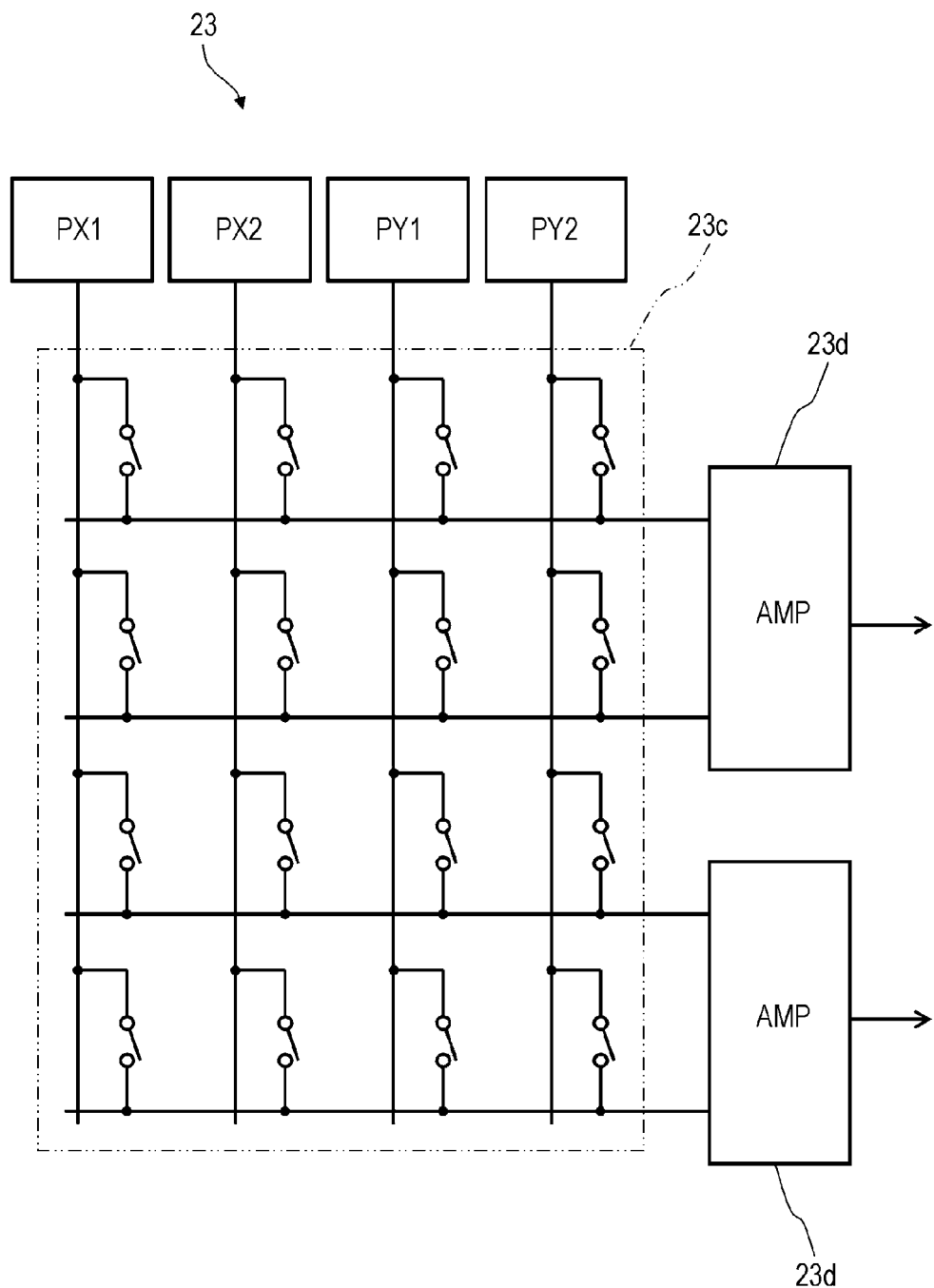
FIG. 15 is a circuit diagram illustrating a sets switching unit included in a processing circuit chip of the third embodiment.

FIG. 11 is a perspective view of a sensor module 5 of a third embodiment of the present invention and is a perspective view when a sealing resin 65 of the sensor module 5 having a side-by-side structure is made partially transparent. FIG. 12 is a perspective view of a sensor module 6 of the third embodiment of the present invention and is a perspective view when a sealing resin 66 of the sensor module 6 having a chip stack structure is made partially transparent. FIG. 13 is a plan view when the sealing resin 65 of the sensor module 5 having the side-by-side structure of the third embodiment is made partially transparent. FIG. 14 is a plan view when the sealing resin 66 of the sensor module 6 having the chip stack structure of the third embodiment is made partially transparent. FIG. 15 is a circuit diagram illustrating a sets switching unit 23c that a processing circuit chip 23 of the third embodiment may include.

The sensor module 5 illustrated in FIG. 11 and the sensor module 6 illustrated in FIG. 12 each configure a two-axis sensor whose sensing target is an external physical quantity. As illustrated in each of FIG. 11 and FIG. 12, a multichip module in which a sensor chip 13 and the processing circuit chip 23 are arranged is adopted. A structure in which chips are two-dimensionally arranged as illustrated in FIG. 11 is called the side-by-side structure, and a structure in which chips are stacked and arranged as illustrated in FIG. 12 is called the chip stack structure.

In the sensor chip 13, an X sensor element 13X and a Y sensor element 13Y, which each detect by using a differential type, may be embedded. Since the X sensor element 13X and the Y sensor element 13Y each have a specific sensitivity axis direction, detection axis directions change as respective physical quantity sensors, depending on an arrangement direction of the sensor chip 13.

In FIG. 11, in the sensor module 5, a wiring substrate 35 may be connected and arranged so that the sensor chip 13 is located on the Y2 side and the processing circuit chip 23 is located on the Y1 side on a plane surface orthogonal to the Z1-Z2 direction. In a case of being arranged as illustrated in FIG. 11, the X sensor element 13X may be a physical quantity sensor that has a sensitivity axis in the X1-X2 direction and that detects a specific physical quantity in a direction headed from the X1 side to the X2 side. In a case of being arranged as illustrated in FIG. 11, the Y sensor element 13Y may be a physical quantity sensor that has a sensitivity axis in the Y1-Y2 direction and that detects a specific physical quantity in a direction headed from the Y1 side to the Y2 side. On the other hand, in a case of being arranged as illustrated in FIG. 12, the sensitivity axis directions are rotated by 180 degrees, physical quantities in respective directions headed from the X2 side to the X1 side and headed from the Y2 side to the Y1 side are detected.

The processing circuit chip 23 converts, into a desired electric signal, and outputs a signal input by the sensor chip 13. In the present embodiment, each of the processing circuit chip 23 and the sensor chip 13 is a bare chip diced after forming integrated circuits on a silicon wafer. As illustrated in FIG. 15, the processing circuit chip 23 includes amplifier circuits 23d that each amplify a differential input and that are each called a differential amplifier. FIG. 15 is a case example including the amplifier circuits 23d.

Furthermore, the processing circuit chip 23 may include the sets switching unit 23c to switch a set of input signals to another set of input signals, in a stage previous to the amplifier circuits 23d. Specifically, as illustrated in FIG. 15, the sets switching unit 23c may be configured by a circuit to switch wiring lines by using switches.

The sensor chip 13 of the sensor module 5 has a back surface on the Z2 side, fixed to the wiring substrate 35 by using an adhesive material, and may include sensor pads P1 for wire bonding, provided on a surface on the Z1 side thereof. The processing circuit chip 23 has a back surface on the Z2 side, fixed to the wiring substrate 35 by using an adhesive material, and may include sensor connection pads P2a and the substrate connection pads P2b, used for wire bonding and provided on a surface on the Z1 side thereof. In addition, the wiring substrate 35 includes the terminal portions P3b for wire bonding, provided on a surface on the Z1 side. The sensor pads P1 and the sensor connection pads P2a, used for wire bonding, are electrically connected to each other via respective bonding wires BW1. Furthermore, the substrate connection pads P2b of the processing circuit chip 23 and the terminal portions P3b of the wiring substrate 35 are electrically connected to each other via the respective bonding wires BW2.

The processing circuit chip 23 of the sensor module 6 has a back surface on the Z2 side, fixed to a wiring substrate 36 by using an adhesive material, and may include the sensor connection pads P2a and the substrate connection pads P2b, used for wire bonding and provided on the surface on the Z1 side thereof. The sensor chip 13 of the sensor module 6 has a back surface on the Z2 side, fixed to the processing circuit chip 23 by using an adhesive material, and may include the sensor pads P1 for wire bonding, provided on a surface on the Z1 side thereof. In addition, the wiring substrate 36 includes the terminal portions P3b for wire bonding, provided on a surface on the Z1 side. The sensor pads P1 and the sensor connection pads P2a, used for wire bonding, are electrically connected to each other via the respective bonding wires BW1. Furthermore, the substrate connection pads P2b of the processing circuit chip 23 and the terminal portions P3b of the wiring substrate 36 are electrically connected to each other via the respective bonding wires BW2.

Next, a characterizing portion in which the sensor pads P1 and the sensor connection pads P2a are arranged in the present embodiment will be described in detail.

In order to be connected to the sensor connection pads P2a of the processing circuit chip 23 by using the bonding wires BW1, the sensor pads P1 of the sensor chip 13 may be arranged so as to face one side of the outer circumference of the sensor chip 13 and may be arrayed in a row along the side. As illustrated in FIG. 13 and FIG. 14, the sensor pads P1 may include the power supply pad P1V, the ground pad P1G, and two sets of differential detection signal pads PXA, PXB, PYA, and PYB. The differential detection signal pads PXA and PXB may be arranged side by side on one of two sides of the ground pad P1G, the differential detection signal pads PYA and PYB may be arranged side by side on the other of the two sides of the ground pad P1G, and furthermore, the power supply pad P1V may be arranged in one end (on a Y+ side) of two ends of the sensor pads P1b.

The sensor connection pads P2a of the processing circuit chip 23 may be arrayed in a row along a side of the processing circuit chip 23, which faces one side of the outer circumference of the sensor chip 13. The substrate connection pads P2b may be arrayed along sides different from the side in which the sensor connection pads P2a are arranged. In the present embodiment, the substrate connection pads P2b may be arrayed in two rows on the X1 side and the X2 side.

As illustrated in FIG. 13, the sensor connection pads P2a of the processing circuit chip 23 may include the power supply connection pads P2V, the ground connection pad P2G, and two sets of differential detection signal connection pads PX1, PX2, PY1, and PY2. So as to correspond to the power supply pad P1V, the ground pad P1G, and the two sets of the differential detection signal pads PXA, PXB, PYA, and PYB of the sensor chip 13, the differential detection signal connection pads PX1 and PX2 may be arranged side by side on one of two sides of the ground connection pad P2G, the differential detection signal connection pads PY1 and PY2 may be arranged side by side on the other of the two side of ground connection pad P2G, and furthermore, the power supply connection pads P2V may be arranged at two points serving as two ends of the sensor connection pads P2a. As illustrated in FIG. 13, while one point (on the X2 side) of the two points of the power supply connection pads P2V is connected to the power supply pad P1V of the sensor chip 13 via one of the bonding wires BW1, the other point (on the X1 side) is not connected.

As illustrated in FIG. 14, in the sensor module 6 having the chip stack structure, the above-mentioned sensor chip 13 is stacked and arranged on the processing circuit chip 23, and the module outer shape thereof is further miniaturized. The arrangement direction of the sensor chip 13 is different from that in FIG. 13 so that the sensor pads P1 illustrated in FIG. 14 are able to be put closer to the sensor connection pads P2a.

Usually, it is difficult for bonding wires to be provided so as to intersect with each other, and a trouble such as making contact with each other and being electrically short-circuited is easily caused. Therefore, as illustrated in FIG. 13 and FIG. 14, the bonding wires BW1 adjacent to each other are provided so as to be in parallel to each other. In FIG. 14, the arrangement direction of the sensor chip 13 is different from that in FIG. 13. Therefore, it is difficult to connect the differential detection signal pad PXA and the differential detection signal connection pad PX1 to each other, and the differential detection signal pad PXA is connected to the differential detection signal connection pad PY2. In the same way, the differential detection signal pad PXB is connected to the differential detection signal connection pad PY1, the differential detection signal pad PYA is connected to the differential detection signal connection pad PX2, and the differential detection signal pad PYB is connected to the differential detection signal connection pad PX1.

The ground pad P1G is connected to the ground connection pad P2G, and as described above, the power supply pad P1V is connected to one point (on the X2 side) of the two points of the power supply connection pads P2V.

In this way, the power supply pad P1V and the ground pad P1G of the sensor chip 13 are connected to the processing circuit chip 23 in the same state in the arrangement of each of the side-by-side structure and the chip stack structure. On the other hand, depending on the arrangement, the differential detection signal pads PXA and PXB are connected to the differential detection signal connection pads PY2 and PY1, respectively, the differential detection signal pads PYA and PYB are connected to the differential detection signal connection pads PX2 and PX1, respectively, in the same way, and sensitivity axes and polarities turn out to be changed. However, as illustrated in FIG. 15, the sets switching unit 23c may be configured. Therefore, by switching wiring lines by use of switches, it is possible to put the directions of physical quantities serving as targets into the same desired states.

Hereinafter, advantages obtained by adopting the present embodiment will be described.

The sensor modules 5 and 6 of the present embodiment may each incorporate the sensor chip 13, in which the X sensor element 13X and the Y sensor element 13Y to detect by using differential types are embedded, and the processing circuit chip 23 to process differential detection signals from the sensor chip 13. In the sensor chip 13, the X sensor element 13X and the Y sensor element 13Y, which have respective sensitivity axes orthogonal to each other, may be embedded. The sensor chip 13 may include the sensor pads P1 arranged so as to face the outer circumference thereof, and the sensor pads P1 may include the power supply pad P1V, the ground pad P1G, and the two sets of the differential detection signal pads PXA, PXB, PYA, and PYB. Regarding the two sets of the differential detection signal pads PXA, PXB, PYA, and PYB, centered at the ground pad P1G, the differential detection signal pads PXA and PXB may be arranged side by side on one of the two sides of the ground pad P1G, and the differential detection signal pads PYA and PYB may be arranged side by side on the other of the two sides of the ground pad P1G. Furthermore, the power supply pad P1V may be arranged in one end (on a Y+ side) of two ends of the sensor pads P1b. So as to correspond to the power supply pad P1V, the ground pad P1G, and the two sets of the differential detection signal pads PXA, PXB, PYA, and PYB of the sensor chip 13, the processing circuit chip 23 may include the sensor connection pads P2a including the power supply connection pads P2V, the ground connection pad P2G, and the two sets of the differential detection signal connection pads PX1, PX2, PY1, and PY2. In addition, the power supply connection pads P2V connectable to the power supply pad P1V of the sensor chip 13 may be arranged in the two ends of the sensor connection pads P2a.

Furthermore, the sets switching unit 23c to switch between sets of signals input by the differential detection signal connection pads PX1, PX2, PY1, and PY2 may be included.

According to this configuration, in each of a case of adopting the side-by-side structure and a case of adopting the chip stack structure, it is possible to connect the sensor chip 13 and the processing circuit chip 23 to each other by using the bonding wires BW1, and it is possible for the input signals to be switch by using the sets switching unit 23c so as to be adequately output. From this, in each of a case of adopting the side-by-side structure and a case of adopting the chip stack structure, it becomes possible to realize the sensor modules 5 and 6 without changing the pad arrangement of the sensor chip 13 or the processing circuit chip 23 and remanufacturing it. In addition, it is possible to reduce a cost related to a modification to the sensor chip 13 or the processing circuit chip 23.

Note that the processing circuit chip 23 of the third embodiment is not limited to the arrangement of the differential detection signal pads PXA, PXB, PYA, and PYB of the sensor chip 13, and even if a portion of, for example, the arrangement order thereof is changed, it is possible to adequately perform switching. In addition, even in a case of being combined with the sensor chip 11, it is possible to cause the sets switching unit 23c to adequately perform switching.

Note that while the characteristics of the third embodiment are described by using the sensor modules 5 and 6 each serving as a two-axis sensor module, the present embodiment is not limited to the two-axis sensor module. A configuration in which, for example, a three-axis sensor module is used and a sensor chip and a processing circuit chip process three sets of differential detection signals may be adopted.

While the sensor modules of the embodiments of the present invention and the sensor chips and the processing circuit chip, used therefore, are specifically described as above, the present invention is not limited to the abovementioned embodiments and may be variously modified and implemented without departing from the scope thereof. The present invention may be modified and implemented as, for example, follows and these belong to the technical scope of the present invention.

(1) While, in the sensor module of each of the first embodiment to the third embodiment or the sensor chip and the processing circuit chip, used therefor, a configuration in which, centered at the ground pad P1G, the power supply pads P1V may be arranged in two ends thereof is adopted, the ground pads P1G may be changed so that, centered at the single power supply pad P1V, the ground pads P1G are arranged in the two ends thereof.

Figure 16:
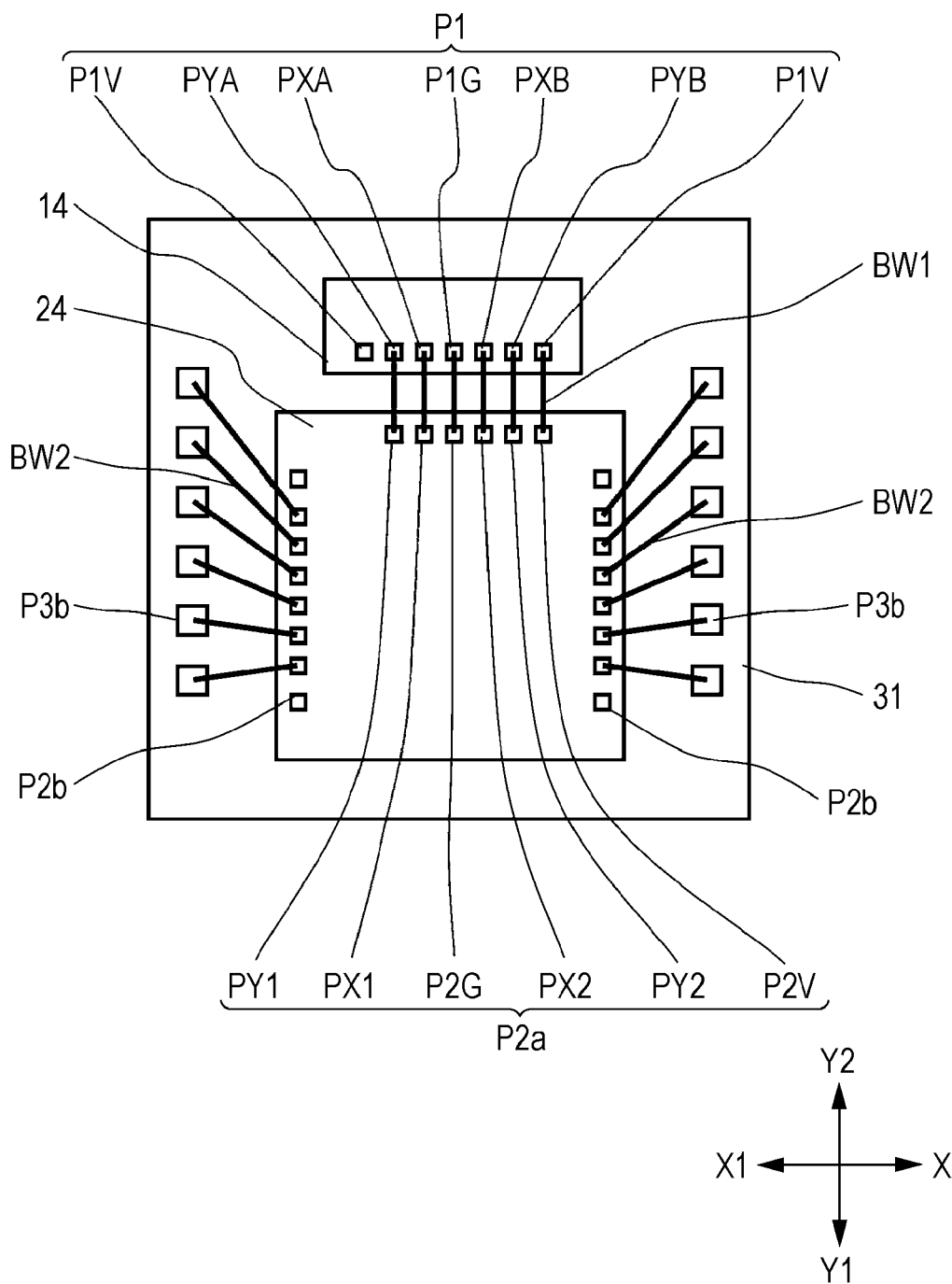
FIG. 16 is a plan view when a sealing resin of a sensor module having the side-by-side structure of a first example of a modification is made partially transparent.

(2) While, in the sensor module of each of the first embodiment to the third embodiment or the sensor chip and the processing circuit chip, used therefor, it is assumed that the power supply connection pads P2V of the processing circuit chip are arranged in the two ends of the sensor connection pads, the power supply pads P1V of the sensor chip may be arranged in the two ends of the pads thereof. FIG. 16 illustrates a first example of a modification. FIG. 16 is a plan view when a sealing resin of a sensor module 7 having the side-by-side structure of the first example of a modification is made partially transparent. By using the same symbols as those of the sensor module 1 of the first embodiment, it is illustrated that the pad arrangement of the first example of a modification is a different arrangement. In this case, it is only necessary to arrange the power supply pads P1V and/or the power supply connection pads P2V. In addition, a configuration in which, centered at the single power supply pad P1V, the ground pads P1G are arranged may be adopted.

Figure 17:
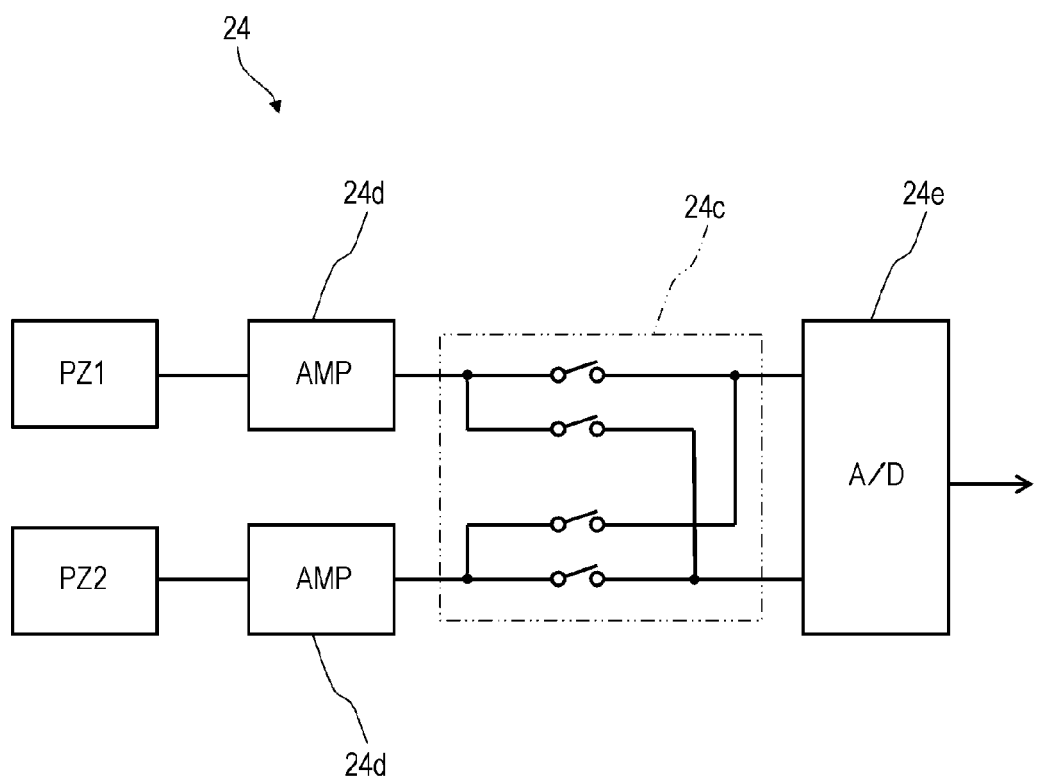
FIG. 17 is a circuit diagram illustrating a polarity switching unit included in a processing circuit chip of a second example of a modification.
Figure 18:
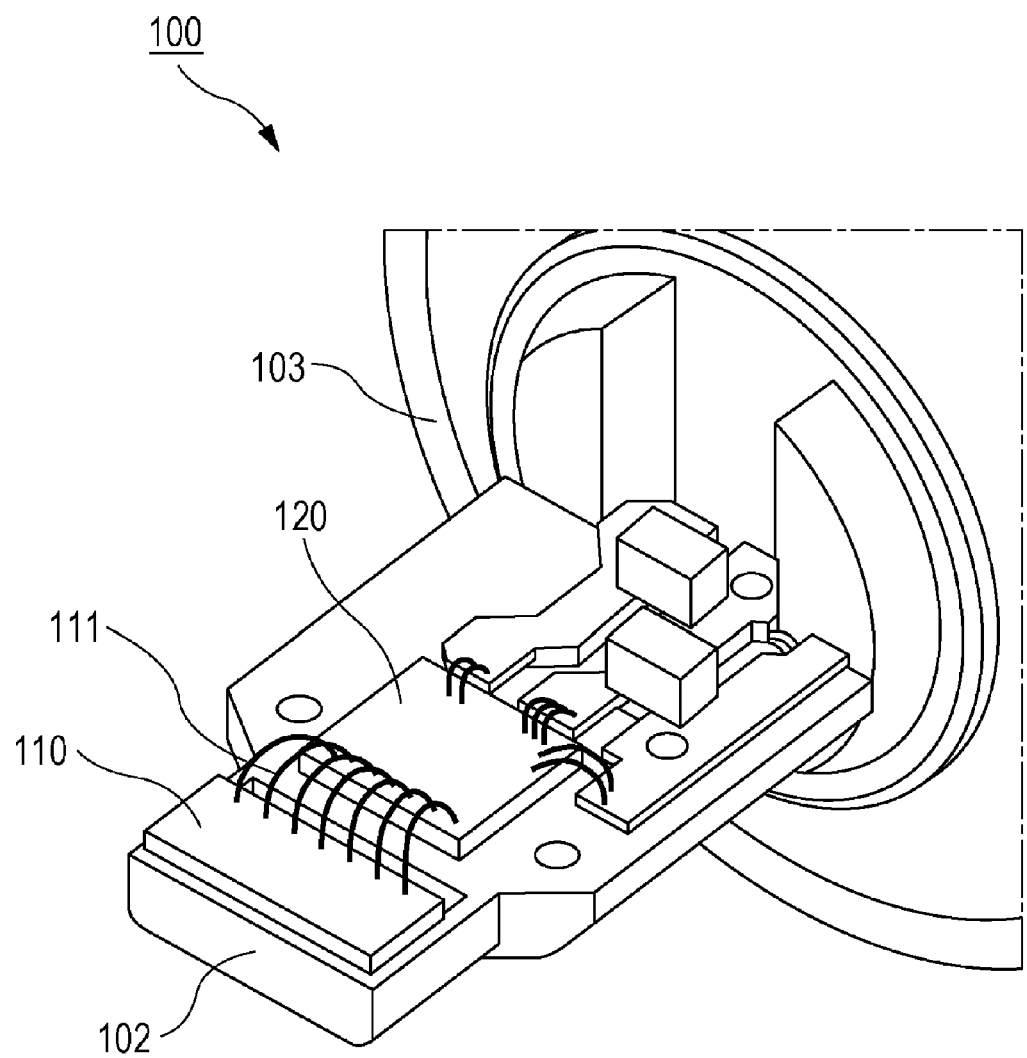
FIG. 18 is an explanatory diagram of a sensor unit arranged in a sensor device of the related art.

(3) While, in each of the sensor modules 3 and 4 of the second embodiment or the processing circuit chip 22 used therefor, the polarity switching unit 22c may be arranged in a stage previous to the amplifier circuit 22d, an amplifier to amplify an input signal may be arranged in a stage previous to the polarity switching unit 22c. FIG. 17 illustrates a second example of a modification. FIG. 17 is a circuit diagram illustrating a polarity switching unit 24c that a processing circuit chip 24 of a second example of a modification may include. In the processing circuit chip 24 illustrated in FIG. 17, the polarity switching unit 24c may be arranged in a stage subsequent to an amplifier circuit 24d and may be connected to an A/D converter circuit 24 including a multi-selector. Outputs of the ND converter circuit 24e are subjected to differential processing by a digital circuit not illustrated. In the same way, while, in each of the sensor modules 5 and 6 of the third embodiment or the processing circuit chip 23 used therefor, the sets switching unit 23c may be arranged in a stage previous to the amplifier circuit 23d, the order may be reversed.

(4) While the sensor module of each of the first embodiment to the third embodiment has a package form utilizing a wiring substrate, a package form in which terminal portions formed by processing a metal lead frame and a mounting portion for a chip are provided may be adopted.

(5) While the sensor module of each of the first embodiment to the third embodiment has a package form covered by a sealing resin, a package form in which a gaseous or vacuum cavity is formed around bonding wires may be adopted.

What is claimed is:

1. A sensor module having a differential type sensor chip, in which two or more sets of sensor elements to detect by using differential types are embedded, and a processing circuit chip that processes differential detection signals from the sensor chip, wherein:

the sensor chip includes:
sensor pads arranged so as to face an outer circumference thereof, the sensor pads include a power supply pad, a ground pad, and two or more pairs of differential detection signal pads, wherein the two or more pairs of differential detection signal pads are arranged on both sides of one of the power supply pad and the ground pad, and the other of the power supply pad and the ground pad is arranged in at least one end of two ends of the sensor pads;

the processing circuit chip includes:
sensor connection pads for connecting to the sensor chip, include: two power supply connection pads arranged in each of two ends of the processing circuit chip, wherein one of the one of the two power supply connection pads on one of the two ends is for connecting to the corresponding power supply pad on the sensor chip while the other of the two power supply connection pads on an opposite end is unconnected, a ground connection pad for connecting to the corresponding ground pad on the sensor chip, and two or more pairs of differential signal connection pads for connecting to the corresponding two or more pairs of differential detection signal pads of the sensor chip.

2. The sensor module according to claim 1, wherein
n sets of the sensor elements are embedded in the sensor chip, wherein n is greater than or equal to 2; and
individual n sets of pad pairs each serve as a set of the pair of differential detection signal pads corresponding to a pair of differential detection signal connection pads, wherein a first pad pair serving as a first set of pad pairs symmetrically arranged on both sides to center at the one of the power supply pad and the ground pad, followed by a next pad pair being sequentially arranged adjacent to the first pad pair and symmetrically disposed on both sides of the one of the power supply pad and the ground pad.

3. The sensor module according to claim 2, wherein
the sensor elements are physical quantity sensors each having a detection axis in a direction parallel to a surface of the sensor chip and each detecting a physical quantity in a direction of the detection axis and have the detection axes orthogonal to each other.

4. The sensor module according to claim 1, wherein
the processing circuit chip includes a polarity switching unit to switch a polarity of a signal input by the pair of differential detection signal connection pads.

5. The sensor module according to claim 1, wherein
the two or more sets of the sensor elements are embedded in the sensor chip, and the two or more pairs of differential detection signal pads are arranged therein in accordance with the number of the two or more sets of the sensor elements; and
the two or more pairs of differential detection signal connection pads are arranged in the processing circuit chip in accordance with the two or more sets of the sensor elements, and the processing circuit chip includes a switching unit to switch a set of signals input by one of the two pairs of differential detection signal connection pads to another set of signals.

6. A processing circuit chip to process a differential detection signal of a differential type sensor chip in which two or more sets of sensor elements to detect by using differential types are embedded, the processing circuit chip comprising:
sensor connection pads for connecting to sensor pads on the sensor chip, wherein the sensor connection pads are arranged so as to face an outer circumference of the sensor chip, wherein the sensor connection pads include: two power supply connection pads arranged in each of two ends of the processing circuit chip, wherein one of the one of the two power supply connection pads on one of the two ends is for connecting to the corresponding power supply pad on the sensor chip while the other of the two power supply connection pads on an opposite end is unconnected, a ground connection pad for connecting to the corresponding ground pad on the sensor chip, and two or more pairs of differential detection signal connection pads for connecting to the corresponding two or more pairs of differential detection signal pads of the sensor chip;
a polarity switching unit to switch a polarity of a signal input by the pair of differential detection signal connection pads, wherein the differential detection signal connection pads in each pair are arranged symmetrically.

7. A processing circuit chip to process a differential detection signal of a differential type sensor chip in which two or more sets of sensor elements to detect by using differential types are embedded, the processing circuit chip comprising:
sensor connection pads for connecting to sensor pads on the sensor chip, wherein the sensor connection pads are arranged so as to face an outer circumference of the sensor chip, wherein the sensor connection pads include: two power supply connection pads arranged in each of two ends of the processing circuit chip, wherein one of the one of the two power supply connection pads on one of the two ends is for connecting to the corresponding power supply pad on the sensor chip while the other of the two power supply connection pads on an opposite end is unconnected, a ground connection pad for connecting to the corresponding ground pad on the sensor chip, and two or more pairs of differential detection signal connection pads for connecting to the corresponding two or more pairs of differential detection signal pads of the sensor chip, wherein even number of pairs of differential detection signal pads are arranged on both sides of a center pad, same number thereon, respectively;
the two or more sets of the sensor elements are embedded in the sensor chip, and the two or more pairs of differential detection signal pads are arranged therein in accordance with the number of the two or more sets of the sensor elements; and
the two or more pairs of differential detection signal connection pads are arranged in accordance with the two or more sets of the sensor elements, and a sets switching unit to switch, to another set of signals, a switching unit to switch a set of signals input by one of the two pairs of differential detection signal connection pads to another set of signals.

8. A sensor module having a differential type sensor chip, in which two or more sets of sensor elements to detect by using differential types are embedded, and a processing circuit chip that processes differential detection signals from the sensor chip, wherein:
the processing circuit chip includes:
sensor connection pads arranged so as to face an outer circumference thereof, the sensor connection pads include a power supply pad, a ground pad, and two or more pairs of differential signal connection pads, wherein the two or more pairs of differential signal connection pads are arranged on both sides of one of the power supply pad and the ground pad, and the other of the power supply pad and the ground pad is arranged in at least one end of two ends of the sensor connection pads;
the sensor chip includes:
sensor pads for connecting to the processing circuit chip, include: two power supply pads arranged in each of two ends of the sensor chip, wherein one of the one of the two power supply pads on one of the two ends is for connecting to the corresponding power supply connection pad on the processing circuit chip while the other of the two power supply pads on an opposite end is unconnected, a ground connection pad for connecting to the corresponding ground pad on the processing circuit chip, and two or more pairs of differential detection signal connection pads for connecting to the corresponding two or more pairs of differential signal connection pads of the processing circuit chip.

* * * * *